(12) United States Patent
Petropoulos

(10) Patent No.: US 6,262,576 B1
(45) Date of Patent: Jul. 17, 2001

(54) PHASED ARRAY PLANAR GRADIENT COIL SET FOR MRI SYSTEMS

(75) Inventor: Labros S. Petropoulos, Solon, OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/441,030

(22) Filed: Nov. 16, 1999

(51) Int. Cl.[7] ......................................................... G01V 3/00
(52) U.S. Cl. .............................................. 324/318; 600/410
(58) Field of Search .................................... 324/318, 319, 324/320, 322, 300, 306, 307, 309; 600/410, 421, 422

(56) References Cited

U.S. PATENT DOCUMENTS

| | | | |
|---|---|---|---|
| 4,794,338 | 12/1988 | Roemer et al. | 324/39 |
| 5,036,282 | 7/1991 | Morich et al. | 324/318 |
| 5,132,618 | 7/1992 | Sugimoto | 324/318 |
| 5,278,504 | 1/1994 | Patrick et al. | 324/318 |
| 5,296,810 | 3/1994 | Morich | 324/318 |
| 5,581,187 | * 12/1996 | Pausch | 324/318 |
| 5,736,858 | 4/1998 | Katznelson et al. | 324/318 |
| 5,942,898 | 8/1999 | Petropoulos et al. | 324/318 |
| 5,952,830 | 9/1999 | Petropoulos et al. | 324/318 |
| 5,977,771 | * 11/1999 | Petropoulos | 324/318 |

* cited by examiner

Primary Examiner—Louis Arana
(74) Attorney, Agent, or Firm—Fay, Sharpe, Fagan, Minnich & McKee, LLP

(57) ABSTRACT

A uniplanar gradient coil assembly (40) generates substantially linear gradient magnetic fields through an examination region (14). The gradient coil assembly (40) includes at least a pair of primary uniplanar gradient coil sets (40a, 40b) and a pair of shield coil sets (41a, 41b) which are disposed in an overlapping relationship. One gradient coil set is displaced relative to the other gradient coil set such that the mutual inductance between the two is minimized. Preferably, the coil sets (40a, 40b, 41a, 41b) are symmetric, such that the sweet spot of each coil is coincident with the geometric center of each coil. One primary uniplanar gradient coil set (40a) is a high efficiency, high switching speed coil to enhance performance of ultrafast magnetic resonance sequences, while the second primary uniplanar gradient coil set (40b) is a low efficiency coil which generates a high quality gradient magnetic field, but with slower switching speeds. By displacing one gradient coil set relative to the other, mutual inductance is minimized, which maximizes peak gradient, rise time, and slew rate, while dB/dt levels are minimized. In one embodiment, the uniplanar gradient coil assembly (40) is housed within an interior of a couch (30).

30 Claims, 16 Drawing Sheets

PHASED ARRAY PLANAR GRADIENT COIL SET FOR MRI SYSTEMS

BACKGROUND OF THE INVENTION

The present invention relates to the magnetic resonance arts. It finds particular application in conjunction with gradient coils for a magnetic resonance imaging apparatus and will be described with particular reference thereto. However, it is to be appreciated that the present invention will also find application in conjunction with localized magnetic resonance spectroscopy systems and other applications which utilize gradient magnetic fields.

In magnetic resonance imaging, a uniform magnetic field is created through an examination region in which a subject to be examined is disposed. A series of radio frequency pulses and magnetic field gradients are applied to the examination region to excite and manipulate magnetic resonance. Gradient fields are conventionally applied as a series of gradient pulses with pre-selected profiles. The radio frequency pulses excite magnetic resonance and the gradient field pulses phase and frequency encode the induced resonance. In this manner, phase and frequency encoded magnetic resonance signals are generated.

More specifically, the gradient magnetic field pulses are typically applied to select and encode the magnetic resonance with spatial position. In some embodiments, the magnetic field gradients are applied to select a slice or slab to be imaged. Ideally, the phase or frequency encoding uniquely identifies spatial location.

Conventionally, the uniform main magnetic field is generated in one of two ways. The first method employs a cylindrically shaped solenoidal main magnet. The central bore of the main magnet defines the examination region in which a horizontally directed main magnetic field is generated. The second method employs a main magnet having opposing poles arranged facing one another to define therebetween the examination region. The poles are typically connected by a C-shaped or a four post ferrous flux return path. This configuration generates a vertically directed main magnetic field within the examination region. The C-shaped main magnet, often referred to as having open magnet geometry, has resolved important MRI issues, such as increasing the patient aperture, avoiding patient claustrophobia, and improving access for interventional MRI applications. However, the design of gradient coils for generating linear magnetic field gradients differs from that for the bore-type horizontal field system due to the direction of the magnetic field.

When designing gradient coils for magnetic resonance imaging, many opposing factors must be considered. Typically, there is a trade off between gradient speed and image quality factors, such as volume, uniformity, and linearity. Some magnetic resonance sequences require a gradient coil which emphasizes efficiency, while other sequences are best with a gradient coil which emphasizes image quality factors. For example, a gradient coil which has a large linear imaging volume is advantageous for spine imaging, but is disadvantageous in terms of the dB/dt when switched with a high slew rate.

Open magnetic systems with vertically directed fields are attractive for MRI applications because an open magnet geometry increases the patient aperture and increases access for interventional MRI applications. In such open magnet systems, it has been known to use a bi-planar gradient coil assembly for generation of magnetic field gradients. However, the use of this type of bi-planar gradient coil assembly somewhat detracts from the purposes for using an open magnet geometry in that it reduces the patient aperture and diminishes access for interventional procedures by employing two planar gradient coils, one on either side of the subject being examined. In addition, the performance of the bi-planar configuration often suffers in terms of its gradient strength, slew rate, and dB/dt levels.

A single uniplanar gradient coil may remedy some of the aforementioned bi-planar shortcomings in regard to gradient strength and slew rate. However, such a structure often suffers from a reduced field of view, which affects applications requiring larger spatial coverage, such as spinal imaging. In order to increase the spatial coverage provided by a uniplanar or bi-planar gradient coil, the uniformity and linearity of the gradient magnetic field must be improved. In addition, the strength of the gradient field must be increased to address the demand for a higher resolution image. These two factors have a detrimental effect on the dB/dt level for the gradient coil.

The present invention contemplates a new and improved gradient coil assembly which overcomes the above-referenced problems and others.

SUMMARY OF THE INVENTION

In accordance with one aspect of the present invention, a magnetic resonance imaging apparatus includes a main magnet for generating a main magnetic field through and surrounding an examination region. A couch supports a subject within the examination region. A planar gradient coil assembly is disposed on one side of the subject and generates gradient magnetic fields across the examination region. The planar gradient coil assembly includes at least a first primary planar gradient coil set and a second primary planar gradient coil set which are disposed in an overlapping relationship. The first primary planar gradient coil set is displaced relative to the second primary planar gradient coil set such that mutual inductance between the two planar gradient coil sets is minimized. A current supply supplies electrical current to the planar gradient coil assembly such that magnetic field gradients are selectively generated across the examination region in the main magnetic field by the planar gradient coil assembly. An RF pulse generator selectively excites magnetic resonance dipoles disposed within the examination region and a receiver receives magnetic resonance signals from resonating dipoles within the examination region. A reconstruction processor reconstructs the demodulated magnetic resonance signals into an image representation.

In accordance with another aspect of the present invention, a method of magnetic resonance includes generating a vertical main magnetic field across an examination region. It further includes applying a first gradient magnetic field across the examination region with a first planar gradient coil during resonance excitation. A second gradient magnetic field is applied across the examination region with a second planar gradient coil during resonance data acquisition. The acquired resonance data is reconstructed into an image representation.

In accordance with another aspect of the present invention, a method of designing a phased array gradient coil assembly for a magnetic resonance imaging system includes selecting geometric configurations for a primary coil set having a corresponding shield coil set and a second primary coil set having a corresponding second shield coil set. The method further includes generating first and second continuous current distributions for the first primary and shield coil sets and third and fourth continuous current distributions for the second primary and shield coil sets. The first primary coil set is optimized with the first shield coil set using an energy/inductance minimization algorithm. Next, the second primary coil set is optimized with the second shield coil set using an energy/inductance minimization algorithm. Eddy currents are evaluated within the prescribed imaging volume for both the first and second primary coil sets and at least one characteristic of the geometric configurations defined above are modified if the eddy currents do not meet specified target values. The first primary and shield coil sets and the second primary and shield coil sets are discretized. The first primary coil set is at least one of axially and radially displaced relative to the second primary coil set such that mutual inductance between the two is minimized.

In accordance with another aspect of the present invention, a phased array planar gradient coil assembly for generating magnetic gradients across a main magnetic field of a magnetic resonance apparatus includes a first primary planar coil set and a second primary planar coil set each including first and second planar x, y, and z-gradient coils having sweet spots in which the magnetic field gradient generated is substantially linear. The respective sweet spots are coincident with an examination region. The first and second primary planar coil sets are disposed in an overlapping relationship with the first primary planar coil set being displaced relative to the second primary planar coil set such that the mutual inductance between the two is minimized. The gradient coil assembly further includes at least one planar shielding coil set between the first and second primary planar coil sets and a main magnet. The at least one planar shielding coil set generates a magnetic field which substantially zeroes magnetic field gradients outside the shielding coil set.

One advantage of the present invention is that it reduces the resistance of the gradient coil assembly.

Another advantage of the present invention is that it increases the duty cycle of the gradient coil assembly.

Another advantage of the present invention is that it minimizes mutual inductance of the gradient coil assembly.

Another advantage of the present invention is that it increases the field of view of the system without increasing the energy of the system.

Yet another advantage of the present invention is that it reduces dB/dt levels.

Another advantage of the present invention is that it minimizes torque and thrust forces.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
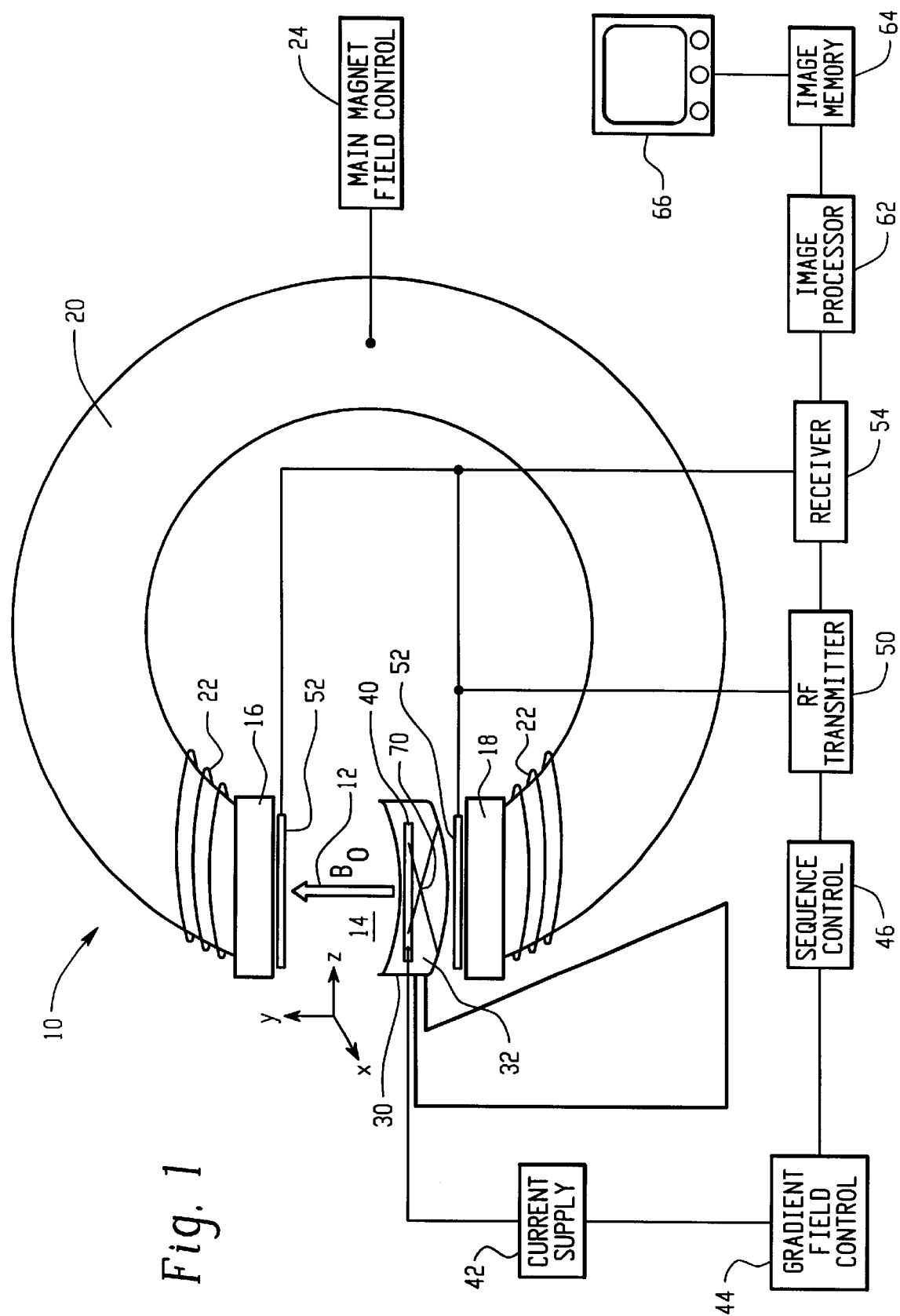
FIG. 1 is a diagrammatic illustration of a magnetic resonance imaging system in accordance with the present invention.

With reference to FIG. 1, a magnetic resonance imaging apparatus 10 generates a substantially uniform vertical magnetic field 12 through an examination region 14 defined by opposing magnetic pole pieces 16, 18. Preferably, the main magnetic field 12 is a strong, substantially uniform field that is aligned with a y or vertical axis. Although an open field magnet with a vertically directed field is illustrated in FIG. 1, it is to be appreciated that the present invention is equally applicable to bore-type magnetic systems with horizontally directed fields (along the z-direction). In the illustrated embodiment, the opposing magnetic pole pieces 16, 18 are connected by a ferrous flux return path 20. Electrical main field coils 22 are operated under control of a main magnetic field control circuit 24. Preferably, the main magnetic field coils 22 include coil segments disposed adjacent to or in conjunction with each of the opposing magnetic pole pieces 16, 18. However, the main field coils 22 may be disposed anywhere along the ferrous flux return path 20.

A couch 30 suspends a subject within the examination region 14. Preferably, the couch 30 is movable so as to be selectively inserted and retracted from the examination region. An interior cavity 32 of the couch 30 houses a uniplanar gradient coil assembly 40. The uniplanar gradient coil assembly 40 selectively creates gradient magnetic fields across the examination region 14. In one embodiment, a mechanical adjustment mechanism 70 adjusts the height of the uniplanar gradient coil assembly 40 to align the magnetic gradient region having optimum linearity with an area of interest of the subject.

A current supply 42 selectively supplies electrical current pulses to the coil loop arrays of the uniplanar gradient coil assembly 40. A gradient field control means 44 is controlled by a sequence control processor 46 to control the current supply to apply appropriate current pulses to the windings of the coil loop arrays to cause selected gradient pulses.

The sequence control processor 46 controls a radio frequency transmitter 50 for generating radio frequency pulses of the appropriate frequency spectrum for inducing resonance in selected dipoles disposed in the examination region 14. The radio frequency transmitter 50 is connected to a radio frequency antennae 52 disposed adjacent the examination region for transmitting radio frequency pulses into a region of interest of the patient or other subject in the examination region 14. The radio frequency antennae may be disposed adjacent a surface of the magnetic pole pieces 16, 18, in the interior cavity 32 of the couch 30, or on the subject to be examined. For example, a surface coil may be positioned contiguous to an examined patient or subject for controllably inducing magnetic resonance in a selected contiguous region of the patient.

A magnetic resonance receiver 54 receives signals from resonating dipoles within the examination region 14. The signals are received via the same antennae that transmits the radio frequency pulses. Alternately, separate receiver coils may be used. For example, receive only surface coils may be disposed contiguous to a selected region of the patient to receive resonance induced therein by a radio frequency transmitting coil surrounding the examination region 14. Ultimately, the radio frequency signals received are demodulated and reconstructed into an image representation by a reconstruction processor 62. The image may represent a planar slice through the patient, an array of parallel planar slices, a three dimensional volume, or the like. The image is then stored in an image memory 64 where it may be accessed by a display 66, such as a video monitor, which provides a human-readable display of the resultant image.

Figure 2:
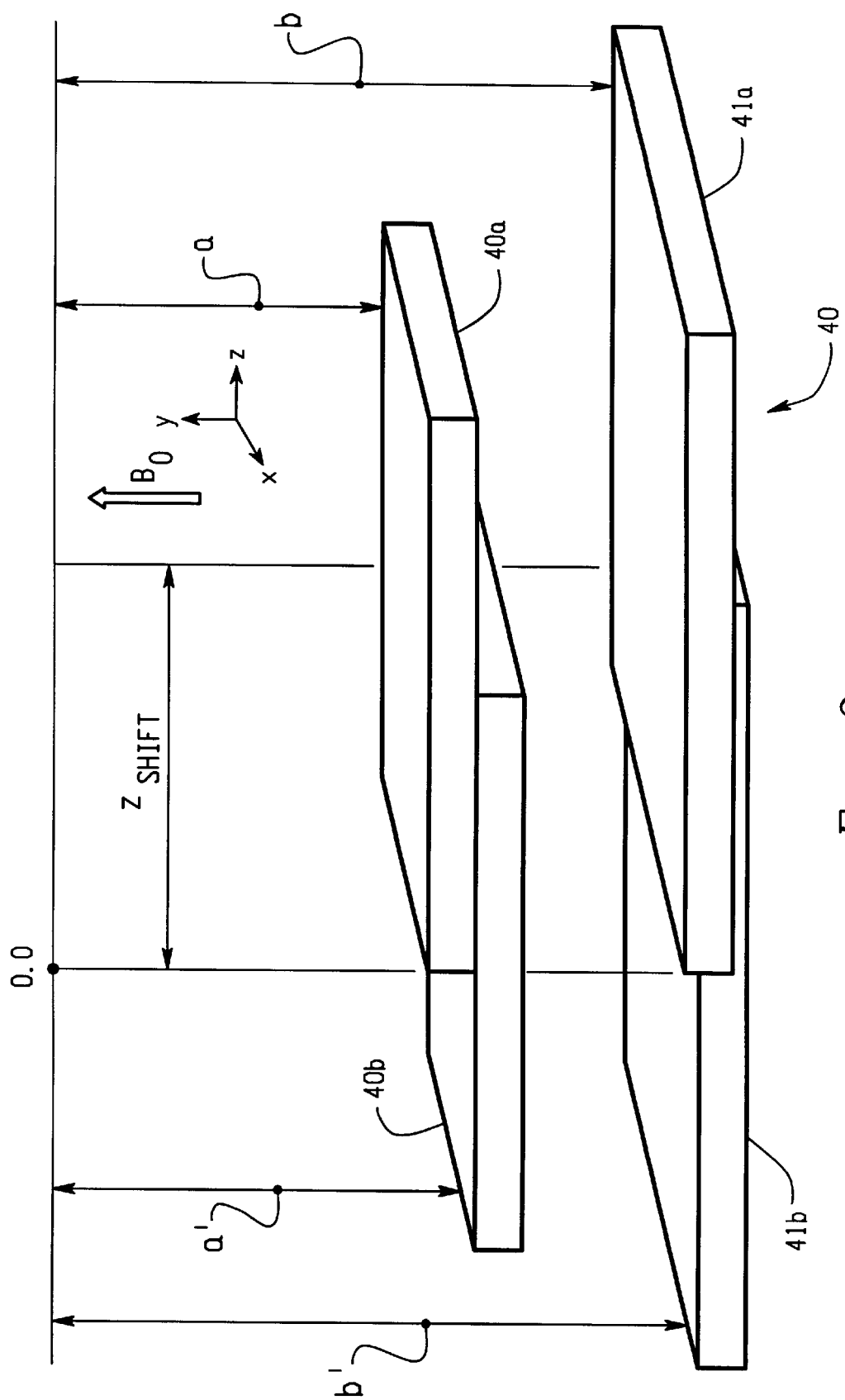
FIG. 2 is a diagrammatic illustration of the planar gradient coil assembly in accordance with the present invention.

With reference to FIG. 2 and continuing reference to FIG. 1, the gradient coil assembly preferably includes a pair of primary gradient coil sets 40*a*, 40*b* and a corresponding pair of shield coil sets 41*a*, 41*b*. In one embodiment, the gradient coil assembly 40 is housed within the couch 30. Alternately, the gradient coil assembly may be located outside of the couch on one side of the subject.

Preferably, the primary gradient coil sets are symmetric, i.e., each coil set's "sweet spot" (region where the gradient magnetic field is substantially linear) is coincident with the geometric center of the gradient coil set. It is to be appreciated that the present invention may contain only asymmetric gradient coil sets, only symmetric gradient coil sets, and both asymmetric and symmetric gradient coil sets. In addition, it is to be appreciated that more than two primary gradient coil sets may be overlapped in a phased array relationship. Such a phased array configuration increases the field of view for applications such as spinal imaging. Also, it is to be appreciated that there is no requirement that the sweet spots of the respective gradient coil sets coincide. Further, it is to be appreciated that two uniplanar phased arrays may be symmetrically disposed on both sides of the examination region to form a bi-polar phased array gradient coil assembly.

As shown in FIG. 2, the first primary gradient coil set 40*a* is displaced axially (i.e., along the z-axis) with respect to the second primary gradient coil set 40*b*. Alternately, the first primary gradient coil set may be displaced axially, i.e., with respect (along the y-axis) to the second primary gradient coil set. The axial and/or radial displacement of one primary gradient coil set relative to the other is determined by a mutual inductance minimization algorithm, which will be discussed in full detail below. By displacing one gradient coil set relative to another gradient coil set, the mutual inductance or interaction between the two is minimized. For example, in FIG. 2, the second primary gradient coil 40*b* is displaced axially (along the z direction) by an amount $Z_{SHIFT}$. This feature maximizes peak gradient, rise time, and slew rate and leads to overall greater coil efficiency. Further, using uniplanar gradient coils in the inductance minimizing configuration lowers the coil's resistance and increases the duty cycle of the coil. With uniplanar coils, the entire length of the coil is utilized which controls the current density by allowing it to be distributed with wider copper loops for lower resistance and reduced heat dissipation. As a result, no elaborate cooling system is required.

Preferably, the first primary gradient coil set is a high efficiency coil set which enhances performance of ultrafast magnetic resonance sequences. Such a coil set minimizes dB/dt levels and eddy current effects. Preferably, the second primary gradient coil set is a low efficiency coil set capable of generating a high quality gradient field. Such a coil set typically is ideal for imaging applications with inherently low dB/dt and eddy current levels.

Each uniplanar gradient coil set of the uniplanar gradient coil assembly includes an x, y, and z coil loop array. The y-gradient coil loop array applies gradients along a y-axis. Analogously, the x and z-gradient coil loop arrays generate gradients along the x and z-axes, respectively. Each of the x, y, and z-gradient coil loop arrays include a plurality of symmetrically arranged windings or coil loops, as shown in the figures below. Each of the coil loop arrays are disposed in an individual planar surface which is orthogonal to the main magnetic field 12 in a vertical field system. Alternately, in a bore-type magnet, the coil loop arrays are parallel to the main horizontal magnetic field. The windings are preferably manufactured from a relatively thin conductive sheet, such as copper. The sheet is preferably cut before lamination to the former by water jet cutting, laser cutting, etching or the like, and then bonded to a thin insulating substrate, minimizing radial thickness.

The theoretical development, the design procedure and the numerical results for two symmetric, shielded uniplanar gradient coil sets, each consisting of three gradients coils, is now discussed. In addition, the theoretical development and numerical results for two sets of actively shielded symmetric gradient coils with minimized mutual inductance is discussed. Specifically, the theoretical development, the design, and the results of a gradient coil where the y component of the magnetic field varies linearly along the transverse direction (z, z-gradient coil), as well as, the axial gradient coil (y, y-gradient coil) will be presented.

Figure 3:
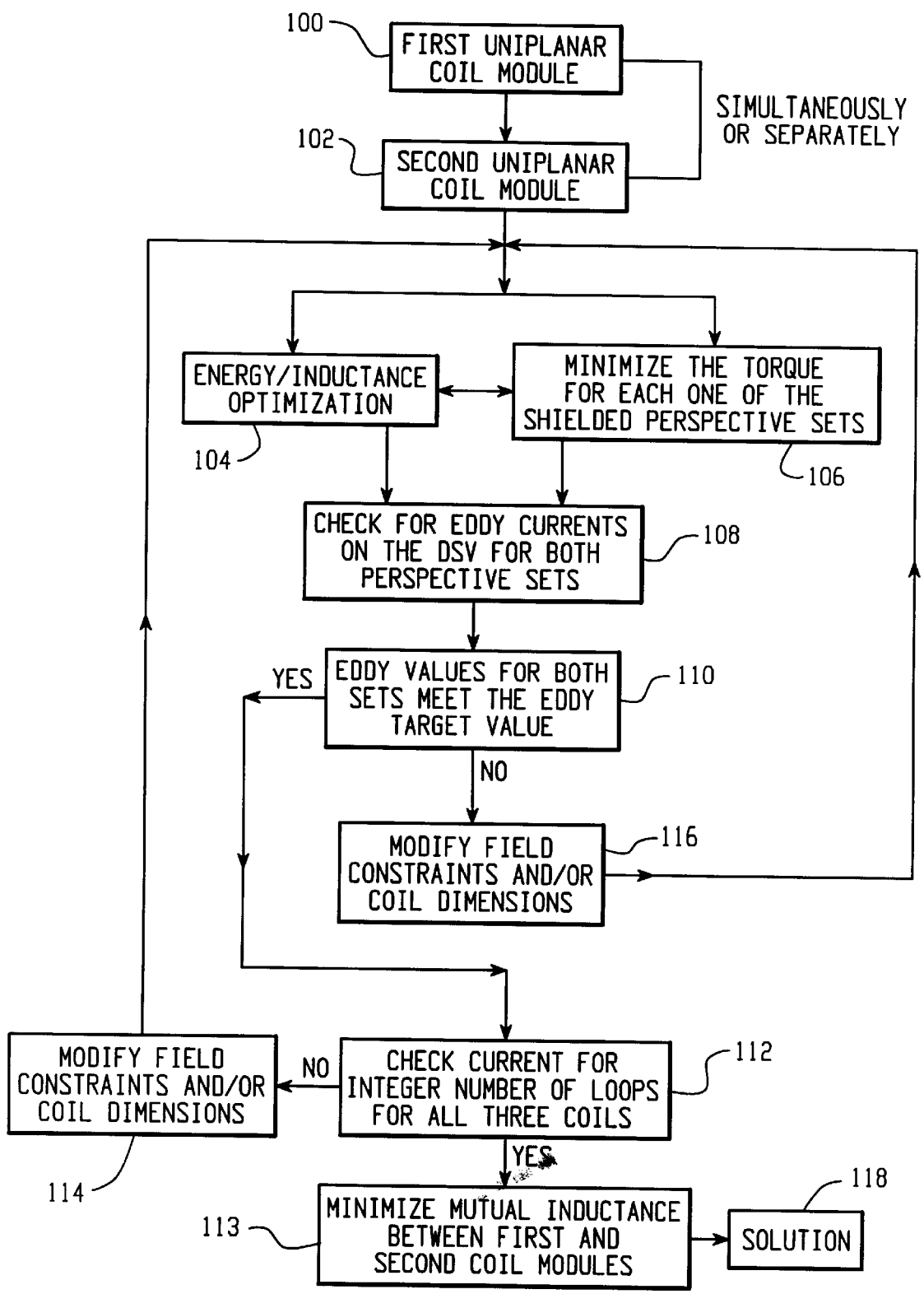
FIG. 3 is a flow chart for designing a shielded planar gradient coil assembly with minimized mutual inductance in accordance with the present invention.

The flow chart for designing such a gradient coil assembly is shown in FIG. 3. Initially, a geometric configurations step sets the geometric configurations of the first uniplanar primary coil with the first symmetric shield 100 and the second uniplanar primary coil with the second symmetric shield 102. Next, an energy/inductance minimization step 104 optimizes each gradient coil set. In addition, a torque minimization step 106 minimizes the torque on each gradient coil set. Next, eddy current inside a prescribed imaging volume is evaluated for each primary coil configuration 108. The eddy currents from each primary coil set with their corresponding shields are compared to target values for the particular volume 110.

If the eddy current target values are met, a current discretization step 112 discretizes the continuous current distributions of each coil set to generate the number of turns which is required for each coil within each coil set. Next, the primary coil and associated shield are examined to determine whether each has an exact integer number of turns when they share common current 112. If this condition is not satisfied, the field characteristics and/or coil geometric configurations are modified 114 and the process proceeds again from the optimization step 104. Similarly, if the eddy current inside the prescribed imaging volume 110 do not meet the target values, the field characteristics and/or coil geometric configurations are modified 116 and the process proceeds again from the optimization step 104. The process continues until an acceptable solution is found 118 which satisfies the target criteria.

The theoretical development of the energy optimization algorithm step 104 is discussed for both the transverse and the axial gradient coil.

Considering the plane for the primary coil positioned at y=−a, while the plane for the secondary coil is positioned at y=−b, and confining the current density on the xz plane, the expression for the current distribution J(x,z) is:

$$\vec{J}(x,z) = [J_x(x,z)\hat{x} + J_z(x,z)\hat{z}] \tag{1}$$

Therefore, the expressions of the two components $A_x$, $A_z$ of the magnetic vector potential for y≥−a are:

$$A_x = \tag{2}$$
$$\frac{\mu_0}{8\pi^2} \int\int_{-\infty}^{+\infty} \frac{d\alpha d\beta}{\sqrt{\alpha^2+\beta^2}} e^{i\alpha x + i\beta z} \left[ J_x^{-a}(\alpha,\beta) e^{-\sqrt{\alpha^2+\beta^2}\,(y+a)} + J_x^{-b}(\alpha,\beta) e^{-\sqrt{\alpha^2+\beta^2}\,(y+b)} \right]$$

$$A_z = \tag{3}$$
$$\frac{\mu_0}{8\pi^2} \int\int_{-\infty}^{+\infty} \frac{d\alpha d\beta}{\sqrt{\alpha^2+\beta^2}} e^{i\alpha x + i\beta z} \left[ J_z^{-a}(\alpha,\beta) e^{-\sqrt{\alpha^2+\beta^2}\,(y+a)} + J_z^{-b}(\alpha,\beta) e^{-\sqrt{\alpha^2+\beta^2}\,(y+b)} \right]$$

In addition, the expressions of the two components $A_x$, $A_z$ of the magnetic vector potential for y≤−b are:

$$A_x = \tag{4}$$
$$\frac{\mu_0}{8\pi^2} \int\int_{-\infty}^{+\infty} \frac{d\alpha d\beta}{\sqrt{\alpha^2+\beta^2}} e^{i\alpha x + i\beta z} \left[ J_x^{-a}(\alpha,\beta) e^{\sqrt{\alpha^2+\beta^2}\,(y+a)} + J_x^{-b}(\alpha,\beta) e^{\sqrt{\alpha^2+\beta^2}\,(y+b)} \right]$$

$$A_z = \tag{5}$$
$$\frac{\mu_0}{8\pi^2} \int\int_{-\infty}^{+\infty} \frac{d\alpha d\beta}{\sqrt{\alpha^2+\beta^2}} e^{i\alpha x + i\beta z} \left[ J_z^{-a}(\alpha,\beta) e^{\sqrt{\alpha^2+\beta^2}\,(y+a)} + J_z^{-b}(\alpha,\beta) e^{\sqrt{\alpha^2+\beta^2}\,(y+b)} \right]$$

where $J_{\{x,z\}}(\alpha,\beta)$ represents the double Fourier transform of the $J_{\{x,z\}}(x,z)$ components of the current density, respectively. Considering the current continuity equation ($\vec{\nabla}\cdot\vec{J}=0$), the relationship for these two components of the current density in the Fourier domain is:

$$J_z(\alpha,\beta) = -\frac{\alpha}{\beta} J_x(\alpha,\beta) \tag{6}$$

In this case, Equations (3) and (5) have the form:

$$A_z = \tag{7}$$
$$\frac{\mu_0}{8\pi^2} \int\int_{-\infty}^{+\infty} \frac{d\alpha d\beta}{\sqrt{\alpha^2+\beta^2}} e^{i\alpha x + i\beta z} \left(-\frac{\alpha}{\beta}\right)\left[ J_x^{-a}(\alpha,\beta) e^{-\sqrt{\alpha^2+\beta^2}\,(y+a)} + J_x^{-b}(\alpha,\beta) e^{-\sqrt{\alpha^2+\beta^2}\,(y+b)} \right] \text{ for } y \geq -a$$

$$A_z = \frac{\mu_0}{8\pi^2} \int\int_{-\infty}^{+\infty} \frac{d\alpha d\beta}{\sqrt{\alpha^2+\beta^2}} e^{i\alpha x + i\beta z} \left(-\frac{\alpha}{\beta}\right)\left[ J_x^{-a}(\alpha,\beta) e^{\sqrt{\alpha^2+\beta^2}\,(y+a)} + J_x^{-b}(\alpha,\beta) e^{\sqrt{\alpha^2+\beta^2}\,(y+b)} \right] \text{ for } y \leq -b \tag{8}$$

Furthermore, the expressions of the two components for magnetic vector potential at the surfaces of the two planes (y=−a, and y=−b) have the form:

$$A_x = \tag{9}$$
$$\frac{\mu_0}{8\pi^2} \int\int_{-\infty}^{+\infty} \frac{d\alpha d\beta}{\sqrt{\alpha^2+\beta^2}} e^{i\alpha x + i\beta z} \left[ J_x^{-a}(\alpha,\beta) + J_x^{-b}(\alpha,\beta) e^{-\sqrt{\alpha^2+\beta^2}\,(b-a)} \right] \text{ for } y = -a$$

$$A_z = \frac{\mu_0}{8\pi^2} \int\int_{-\infty}^{+\infty} \frac{d\alpha d\beta}{\sqrt{\alpha^2+\beta^2}} e^{i\alpha x + i\beta z} \left(-\frac{\alpha}{\beta}\right)\left[ J_x^{-a}(\alpha,\beta) + J_x^{-b}(\alpha,\beta) e^{-\sqrt{\alpha^2+\beta^2}\,(b-a)} \right] \text{ for } y = -a \tag{10}$$

$$A_x = \tag{11}$$
$$\frac{\mu_0}{8\pi^2} \int\int_{-\infty}^{+\infty} \frac{d\alpha d\beta}{\sqrt{\alpha^2+\beta^2}} e^{i\alpha x + i\beta z} \left[ J_x^{-a}(\alpha,\beta) e^{-\sqrt{\alpha^2+\beta^2}\,(b-a)} + J_x^{-b}(\alpha,\beta) \right] \text{ for } y = -b$$

$$A_z = \tag{12}$$
$$\frac{\mu_0}{8\pi^2} \int\int_{-\infty}^{+\infty} \frac{d\alpha d\beta}{\sqrt{\alpha^2+\beta^2}} e^{i\alpha x + i\beta z} \left(-\frac{\alpha}{\beta}\right)\left[ J_x^{-a}(\alpha,\beta) e^{-\sqrt{\alpha^2+\beta^2}\,(b-a)} + J_x^{-b}(\alpha,\beta) \right] \text{ for } y = -b$$

The expression of the component of the gradient field coincidental with the direction of the main magnetic field is $B_y$, and has the following form:

$$B_y = \partial_z A_x - \partial_x A_z \Rightarrow B_y = \frac{\mu_0}{8\pi^2} \int\int_{-\infty}^{+\infty} \frac{d\alpha d\beta}{\sqrt{\alpha^2+\beta^2}} \left[ i\beta + \right. \quad (13)$$

$$\left. i\frac{\alpha^2}{\beta} \right] e^{i\alpha x + i\beta z} \left[ J_x^{-a}(\alpha,\beta) e^{-\sqrt{\alpha^2+\beta^2}(y+a)} + \right.$$

$$\left. J_x^{-b}(\alpha,\beta) e^{-\sqrt{\alpha^2+\beta^2}(y+b)} \right] \text{ for } y \geq -a$$

$$B_y = \frac{\mu_0}{8\pi^2} \int\int_{-\infty}^{+\infty} \frac{d\alpha d\beta}{\sqrt{\alpha^2+\beta^2}} \left[ i\beta + \right. \quad (14)$$

$$\left. i\frac{\alpha^2}{\beta} \right] e^{i\alpha x + i\beta z} \left[ J_x^{-a}(\alpha,\beta) e^{\sqrt{\alpha^2+\beta^2}(y+a)} + \right.$$

$$\left. J_x^{-b}(\alpha,\beta) e^{\sqrt{\alpha^2+\beta^2}(y+b)} \right] \text{ for } y \leq -b$$

Considering the shielding requirements $B_y=0$ at $y=-b$, Equation (14) relates the current densities for the two planes as:

$$J_x^{-b}(\alpha,\beta) = -e^{\sqrt{\alpha^2+\beta^2}(b-a)} J_x^{-a}(\alpha,\beta) \quad (15)$$

and Equation (13) becomes:

$$B_y = \frac{i\mu_0}{8\pi^2} \int\int_{-\infty}^{+\infty} d\alpha d\beta \frac{\sqrt{\alpha^2+\beta^2}}{\beta} e^{i\alpha x + i\beta z} e^{-\sqrt{\alpha^2+\beta^2}(y+a)} \quad (16)$$

$$J_x^{-a}(\alpha,\beta) \left[ 1 - e^{-2\sqrt{\alpha^2+\beta^2}(b-a)} \right] \text{ for } y \geq -a$$

In addition, the stored magnetic energy of the coil is given by:

$$W_m = \frac{1}{2} \int_V d^3x \, \vec{A} \cdot \vec{J} \Rightarrow \quad (17)$$

$$W_m = \frac{\mu_0}{16\pi^2} \int\int_{-\infty}^{+\infty} d\alpha d\beta \frac{\sqrt{\alpha^2+\beta^2}}{\beta^2} |J_x^{-a}(\alpha,\beta)|^2 \left[ 1 - e^{-2\sqrt{\alpha^2+\beta^2}(b-a)} \right]$$

In this section, the theoretical development for the transverse uniplanar shielded gradient coil will be presented. Specifically, the X gradient coil will be presented in its entirety, while the Z gradient coil is simply a rotation of the X current patterns by 90° with respect to the y axis.

For the X gradient coil, the y component of the gradient field must be antisymmetric along the x direction and symmetric along the z and y directions. In this case, Equation (16) becomes:

$$B_y = -\frac{\mu_0}{8\pi^2} \int\int_{-\infty}^{+\infty} d\alpha d\beta \frac{\sqrt{\alpha^2+\beta^2}}{\beta} \sin(\alpha x)\cos(\beta z) e^{-\sqrt{\alpha^2+\beta^2}(y+a)} \quad (18)$$

$$J_x^{-a}(\alpha,\beta) \left[ 1 - e^{-2\sqrt{\alpha^2+\beta^2}(b-a)} \right] \text{ for } y \geq -a$$

which leads to the expression of the Fourier transform for the $J_x^{-a}(\alpha,\beta)$ as:

$$J_x^{-a}(\alpha,\beta) = -4 \int\int_0^{+\infty} dx dz \sin(\alpha x)\sin(\beta z) J_x^{-a}(x,z) \quad (19)$$

Based on the energy minimization mechanism, the functional E is constructed in terms of the magnetic field and the stored magnetic energy as:

$$E(J_x^{-a}) = W_m - \sum_{j=1}^{N} \lambda_j [B_y(\vec{r}_j) - B_{ySC}(\vec{r}_j)] \quad (20)$$

where $\lambda_j$ are the Lagrange multipliers, $B_y(r_j)$ is the calculated value of the magnetic field at the constraint points $r_j$ and $B_{ySC}(r_j)$ are the constraint values of the magnetic field at the constraint points.

Minimizing E with respect to the current density $J_x^{-a}$, a matrix Equation for $J_x^{-a}$ is:

$$J_x^{-a} = -\beta \sum_{j=1}^{N} \lambda_j \sin(\alpha x_j)\cos(\beta z_j) e^{-\sqrt{\alpha^2+\beta^2}(y_j+a)} \quad (20a)$$

where the Lagrange multipliers $\lambda_j$ are determined via the constraint Equation:

$$\sum_{j=1}^{N} C_{ij} \lambda_j = B_{ySC_i} \text{ with} \quad (21)$$

$$C_{ij} =$$

$$\frac{\mu_0}{2\pi^2} \int\int_0^{+\infty} d\alpha d\beta \sqrt{\alpha^2+\beta^2} \sin(\alpha x_i)\cos(\beta z_i) e^{-\sqrt{\alpha^2+\beta^2}(y_i+a)}$$

$$\sum_{j=1}^{N} \lambda_j \sin(\alpha x_j)\cos(\beta z_j) e^{-\sqrt{\alpha^2+\beta^2}(y_j+a)} \left[ 1 - e^{-2\sqrt{\alpha^2+\beta^2}(b-a)} \right]$$

Upon determination of the Lagrange multipliers, the continuous current density distribution for $J_x^{-a}$ and $J_z^{-a}$ components of the current density are generated. For the shielding coil, its current density can be derived by determining the current density of the primary coil via Equation (20a) and subsequently applying the inverse transform to Equation (15). Upon determination of the continuous current densities for both coils, their associated discrete current patterns, which are very close approximations for the continuous current densities can be generated by applying the stream function technique. In order to ensure the integrity of the discretization process, the magnetic field is re-evaluated inside and outside the imaging volume by applying the Biot-Savart formula to both discrete current distributions.

In this section, the theoretical development for the axial uniplanar shielded gradient coil will be presented.

For the Y gradient coil, the y component of the gradient field must be symmetric along the x and z directions. In this case, Equation (16) becomes:

$$B_y = -\frac{\mu_0}{8\pi^2} \int\int_{-\infty}^{+\infty} d\alpha d\beta \frac{\sqrt{\alpha^2+\beta^2}}{\beta} \cos(\alpha x)\cos(\beta z) e^{-\sqrt{\alpha^2+\beta^2}(y+a)} \quad (22)$$

$$\hat{J}_x^{-a}(\alpha,\beta) \left[ 1 - e^{-2\sqrt{\alpha^2+\beta^2}(b-a)} \right] \text{ for } y \geq -a$$

which leads to the expression of the Fourier transform for the $J_x^{-a}(\alpha,\beta)$ as:

$$J_x^{-a}(\alpha,\beta) = i\hat{J}_x^{-a}(\alpha,\beta) \quad (23)$$

and $$\hat{J}_x^{-a}(\alpha,\beta) = 4 \int\int_0^{+\infty} dx dz \cos(\alpha x)\sin(\beta z) J_x^{-a}(x,z)$$

Based on the energy minimization mechanism, the functional E is constructed in terms of the magnetic field and the stored magnetic energy as:

$$E(\hat{J}_x^{-a}) = W_m - \sum_{j=1}^{N} \lambda_j [B_z(\vec{r}_j) - B_{zSC}(\vec{r}_j)] \quad (24)$$

where $\lambda_j$ are the Lagrange multipliers, $B_y(r_j)$ is the calculated value of the magnetic field at the constraint points $r_j$ and $B_{ySC}(r_j)$ are the constraint values of the magnetic field at the constraint points.

Minimizing E with respect to the current density $\hat{J}_x^{-a}$, a matrix Equation for $\hat{J}_x^{-a}$ is:

$$\hat{J}_x^{-a} = -\beta \sum_{j=1}^{N} \lambda_j \cos(\alpha x_j)\cos(\beta z_j) e^{-\sqrt{\alpha^2+\beta^2}\,(y_j+a)} \quad (24a)$$

where the Lagrange multipliers $\lambda_j$ are determined via the constraint Equation:

$$\sum_{j=1}^{N} C_{ij}\lambda_j = B_{ySC_i} \text{ with} \quad (25)$$

$$C_{ij} = \frac{\mu_0}{2\pi^2} \int\int_0^{+\infty} d\alpha d\beta \sqrt{\alpha^2+\beta^2}\, \cos(\alpha x_i)\cos(\beta z_i) e^{-\sqrt{\alpha^2+\beta^2}\,(y_i+a)}$$

$$\sum_{j=1}^{N} \lambda_j \cos(\alpha x_j)\cos(\beta z_j) e^{-\sqrt{\alpha^2+\beta^2}\,(y_j+a)} \left[1 - e^{-2\sqrt{\alpha^2+\beta^2}\,(b-a)}\right]$$

Upon determination of the Lagrange multipliers the continuous current density distribution for $J_x^{-a}$ and $J_z^{-a}$ components of the current density are generated. For the shielding coil, its current density can be derived by determining the current density of the primary coil via Equation (24a) and subsequently applying the inverse transform to Equation (15). Upon determination of the continuous current densities for both coils, their associated discrete current patterns, which are very close approximations for the continuous current densities can be generated by applying the stream function technique. In order to ensure the integrity of the discretization process, the magnetic field is re-evaluated inside and outside the imaging volume by applying the Biot-Savart formula to both discrete current distributions.

Considering two sets of shielded uniplanar gradient modules, where for the first module the plane positions for the primary and secondary coils are $y=-a'$, and $y=-b'$, respectively, while the plane locations for the primary and secondary coils of the second module are $y=-a$ and $y=-b$ respectively. In this example, for computing the mutual energy of the coils, $-a<-a'$ and $-b>-b'$. Also it is considered that the first module coil is shifted axially along the z direction by $z_0$. In this situation, the Fourier transform of the current density for the first module coil can be written as:

$$J_{x,z}^{-a',-b'}(\alpha,\beta) = e^{-i\beta z_0} \int\int_{-\infty}^{+\infty} e^{-i\alpha x'-i\beta(z'-z_0)} J_{x,z}^{-a',-b'}(x',z') \quad (26)$$

In addition to Equations (9)–(13), the expressions of the vector potential at the locations of the first module are $$A_x = \frac{\mu_0}{8\pi^2} \int\int_{-\infty}^{+\infty} \frac{d\alpha d\beta}{\sqrt{\alpha^2+\beta^2}} e^{i\alpha x+i\beta z} \Big[ J_x^{-a}(\alpha,\beta) e^{-\sqrt{\alpha^2+\beta^2}\,(a-a')} + \quad (27)$$

$$J_x^{-b}(\alpha,\beta) e^{-\sqrt{\alpha^2+\beta^2}\,(b-a')} \Big] \text{ for } y = -a'$$

$$A_z = \frac{\mu_0}{8\pi^2} \int\int_{-\infty}^{+\infty} \frac{d\alpha d\beta}{\sqrt{\alpha^2+\beta^2}} e^{i\alpha x+i\beta z} \left(-\frac{\alpha}{\beta}\right)\Big[J_x^{-a}(\alpha,\beta) \quad (28)$$

$$e^{-\sqrt{\alpha^2+\beta^2}\,(a-a')} + J_x^{-b}(\alpha,\beta) e^{-\sqrt{\alpha^2+\beta^2}\,(b-a')}\Big]$$

$$\text{for } y = -a'$$

$$A_x = \frac{\mu_0}{8\pi^2} \int\int_{-\infty}^{+\infty} \frac{d\alpha d\beta}{\sqrt{\alpha^2+\beta^2}} e^{i\alpha x+i\beta z} \Big[ J_x^{-a}(\alpha,\beta) e^{-\sqrt{\alpha^2+\beta^2}\,(b'-a)} + \quad (29)$$

$$J_x^{-b}(\alpha,\beta) e^{-\sqrt{\alpha^2+\beta^2}\,(b-b')} \Big] \text{ for } y = -b'$$

$$A_z = \frac{\mu_0}{8\pi^2} \int\int_{-\infty}^{+\infty} \frac{d\alpha d\beta}{\sqrt{\alpha^2+\beta^2}} e^{i\alpha x+i\beta z} \left(-\frac{\alpha}{\beta}\right)\Big[J_x^{-a}(\alpha,\beta) e^{-\sqrt{\alpha^2+\beta^2}\,(b-a)} + \quad (30)$$

$$J_x^{-b}(\alpha,\beta) e^{-\sqrt{\alpha^2+\beta^2}\,(b-b')} \Big] \text{ for } y = -b'$$

The expression for the mutual energy between these two modules is:

$$W_{mutual} = \tfrac{1}{2} \int_V \vec{A}^{(-a,-b)} \cdot \vec{J}^{(-a',-b')}$$

and with the help of equations (25)–(30), it becomes:

$$W_{mutual} = \frac{\mu_0}{4\pi^2} \int\int_{-\infty}^{+\infty} d\alpha d\beta \frac{\sqrt{\alpha^2+\beta^2}}{\beta^2} e^{i\beta z_0} J_x^{-a}(\alpha,\beta) \quad (31)$$

$$J_x^{-a'*}(\alpha,\beta) e^{-\sqrt{\alpha^2+\beta^2}\,(a-a')} \left[1 - e^{-2\sqrt{\alpha^2+\beta^2}\,(b-(a-a'))}\right]$$

If the mutual energy is evaluated over two gradient modules which represent the same gradient axis and the current density represents the same axis coil, the above expression becomes:

$$W_{mutual} = \frac{\mu_0}{4\pi^2} \int\int_{-\infty}^{+\infty} d\alpha d\beta \frac{\sqrt{\alpha^2+\beta^2}}{\beta^2} \cos(\beta z_0) J_x^{-a}(\alpha,\beta) \quad (32)$$

$$J_x^{-a'*}(\alpha,\beta) e^{-\sqrt{\alpha^2+\beta^2}\,(a-a')} \left[1 - e^{-2\sqrt{\alpha^2+\beta^2}\,(b-(a-a'))}\right]$$

For the first shielded Z uniplanar module, the positions of the two planes for the primary and secondary coils are at $y=-a'=-0.002$ m and $y=-b'=-0.056$ m, respectively. Six constraint points were chosen to define the characteristics of the field inside an imaging volume. The first three constraint points define a gradient strength of 20 mT/m inside the imaging volume with a 12% on-axis linearity. The reason of using three constraint points along the gradient axis is that the on-axis non-linearity of the gradient coil must be contained in acceptable levels. The uniformity of the gradient field inside this imaging volume is restricted to less than 17% from its actual value. This set of constraints is displayed in Table 1.

TABLE 1

Constraints for the first Z shielded Uniplanar Module

| j | $X_j$ in mm | $Y_j$ in mm | $Z_j$ in mm | $B_{ysc}$ in mTesla |
|---|---|---|---|---|
| 1 | 0.0 | 100.0 | 1.000 | 0.0200 |
| 2 | 0.0 | 100.0 | 100.0 | 2.0000 |

TABLE 1-continued

Constraints for the first Z shielded Uniplanar Module

| j | $X_j$ in mm | $Y_j$ in mm | $Z_j$ in mm | $B_{ysc}$ in mTesla |
|---|---|---|---|---|
| 3 | 0.0 | 100.0 | 320.0 | 7.6400 |
| 4 | 180.0 | 100.0 | 1.000 | 0.0190 |
| 5 | 0.0 | 150.0 | 1.000 | 0.0195 |
| 6 | 0.0 | 200.0 | 1.000 | 0.0165 |

For the second shielded Z uniplanar module, the positions of the two planes for the primary and secondary coils are at y=−a=−0.006 m and y=−b=−0.050 m, respectively. Six constraint points were chosen to define the characteristics of the field inside an imaging volume. The first three constraint points define a gradient strength of 20 mT/m inside the imaging volume with a 15% on-axis linearity. The reason for using three constraint points along the gradient axis is that the on-axis non-linearity of the gradient coil must be contained in acceptable levels. The uniformity of the gradient field inside this imaging volume is restricted to less than 20% from its actual value. This set of constraints is displayed in Table 2.

TABLE 2

Constraints for the second Z shielded Uniplanar module

| j | $X_j$ in mm | $Y_j$ in mm | $Z_j$ in mm | $B_{ysc}$ in mTesla |
|---|---|---|---|---|
| 1 | 0.0 | 100.0 | 1.000 | 0.0200 |
| 2 | 0.0 | 100.0 | 100.0 | 2.0000 |
| 3 | 0.0 | 100.0 | 320.0 | 7.3600 |
| 4 | 180.0 | 100.0 | 1.000 | 0.0170 |
| 5 | 0.0 | 150.0 | 1.000 | 0.0195 |
| 6 | 0.0 | 200.0 | 1.000 | 0.0150 |

For the first shielded Y uniplanar module, the positions of the two planes for the primary and secondary coils are at y=−a'=−0.002 m and y=−b'=−0.056 m, respectively. Four constraint points were chosen to define the characteristics of the field inside an imaging volume. The first two constraint points define a gradient strength of 20 mT/m inside the imaging volume with a 19% on-axis linearity. The reason for using two constraint points along the gradient axis is that the on-axis non-linearity of the gradient coil must be contained in acceptable levels. The uniformity of the gradient field inside this imaging volume is restricted to less than 20% from its actual value inside a 40cm Dsv volume. This set of constraints is displayed in Table 3.

TABLE 3

Constraints for the first Y shielded Uniplanar module

| j | $X_j$ in mm | $Y_j$ in mm | $Z_j$ in mm | $B_{ysc}$ in mTesla |
|---|---|---|---|---|
| 1 | 0.0 | 51.0 | 0.000 | 0.0200 |
| 2 | 0.0 | 251.0 | 0.000 | 3.240 |
| 3 | 0.0 | 51.0 | 200.0 | 0.0155 |
| 4 | 180.0 | 51.0 | 0.000 | 0.0180 |

For the second shielded Y uniplanar module, the positions of the two planes for the primary and secondary coils are at y=−a=−0.006 m and y=−b=−0.050 m, respectively. Four constraint points were chosen to define the characteristics of the field inside an imaging volume. The first two constraint points define a gradient strength of 20 mT/m inside the imaging volume with a 19% on-axis linearity. The reason for using two constraint points along the gradient axis is that the on-axis non-linearity of the gradient coil must be contained in acceptable levels. The uniformity of the gradient field inside this imaging volume is restricted to less than 20% from its actual value inside a 40 cm DSV. This set of constraints is displayed in Table 4.

TABLE 4

Constraints for the second Y shielded Uniplanar module

| j | $X_j$ in mm | $Y_j$ in mm | $Z_j$ in mm | $B_{ysc}$ in mTesla |
|---|---|---|---|---|
| 1 | 0.0 | 51.0 | 0.000 | 0.0200 |
| 2 | 0.0 | 251.0 | 0.000 | 3.240 |
| 3 | 0.0 | 51.0 | 200.0 | 0.0155 |
| 4 | 180.0 | 51.0 | 0.000 | 0.0180 |

Figure 4A:
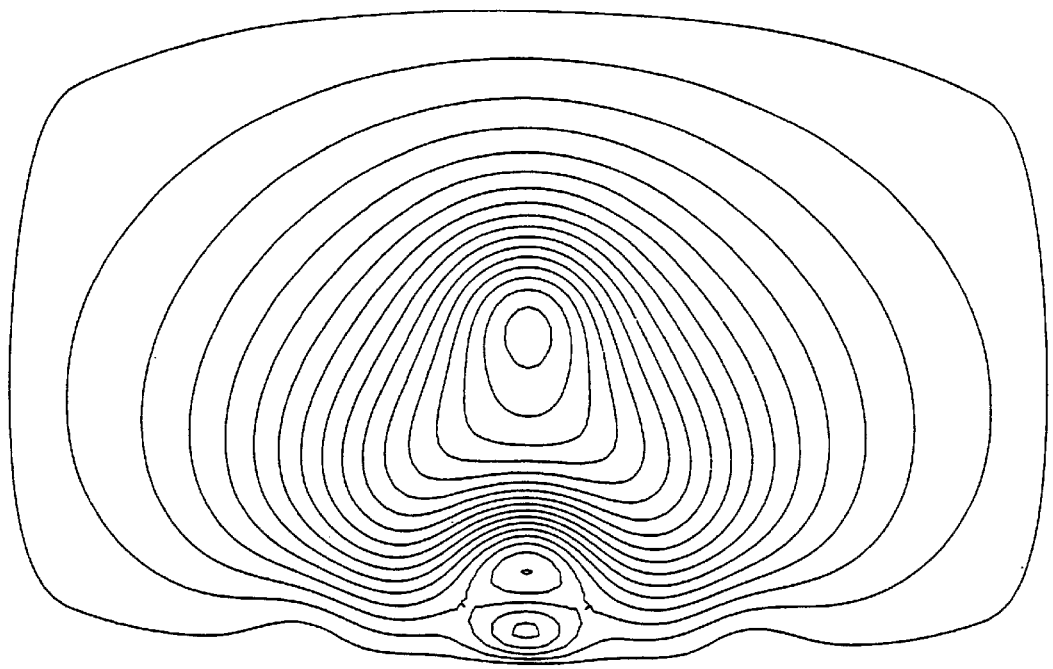
FIGS. 4A and 4B are diagrammatic illustrations of an exemplary first primary symmetric uniplanar z-gradient coil and a first shield coil for a vertical system in accordance with the present invention.
Figure 4B:
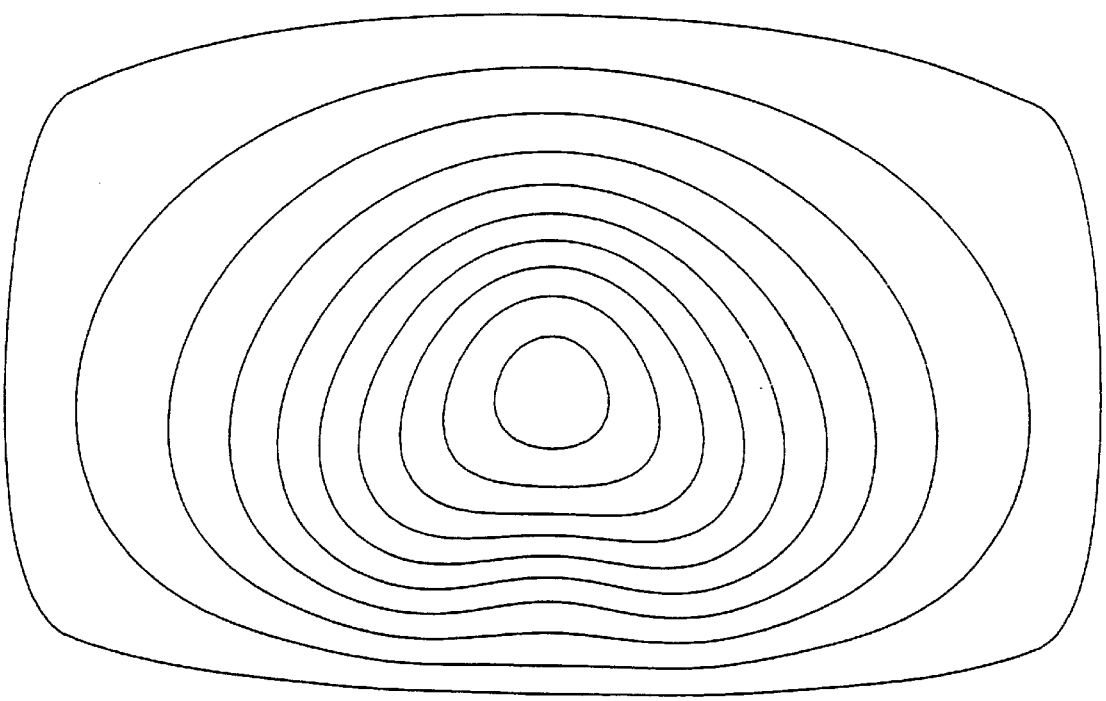
Figure 5:
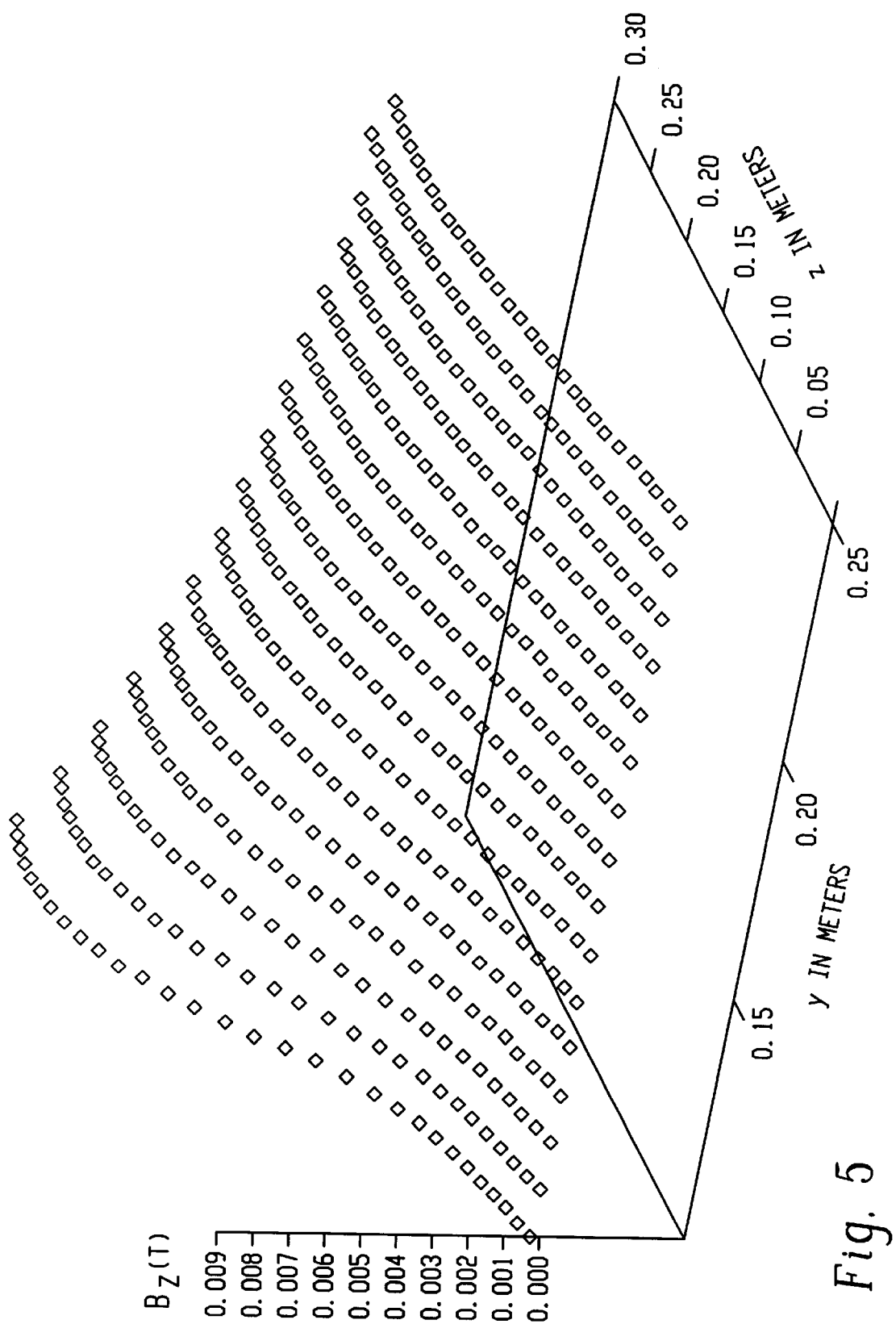
FIG. 5 is a plot of the y-component of the magnetic field along the yz plane at x=0.0 for the first shielded z uniplanar gradient coil for a vertical system in accordance with the present invention.

For the first shield z uniplanar module, by employing the stream function technique, the discrete current pattern for the primary coil consists from 17 discrete loops (FIG. 4A) where each loops carries a constant current of 216.68 Amps. Similarly, the secondary coil's current density is approximated by a 10 loops (FIG. 4B) where each loop carries a constant current of 216.68 Amps. Using the Biot-Savart law, the y component of the magnetic field is evaluated along the yz plane at x=0.0, as shown in FIG. 5. Table 5 shows the electrical characteristics for the first module of the shielded Z uniplanar gradient coil which are designed for main magnets with vertically directed fields. The rise time, slew rates and gradient strengths were evaluated assuming a 400V/330 A gradient amplifier.

Figure 6A:
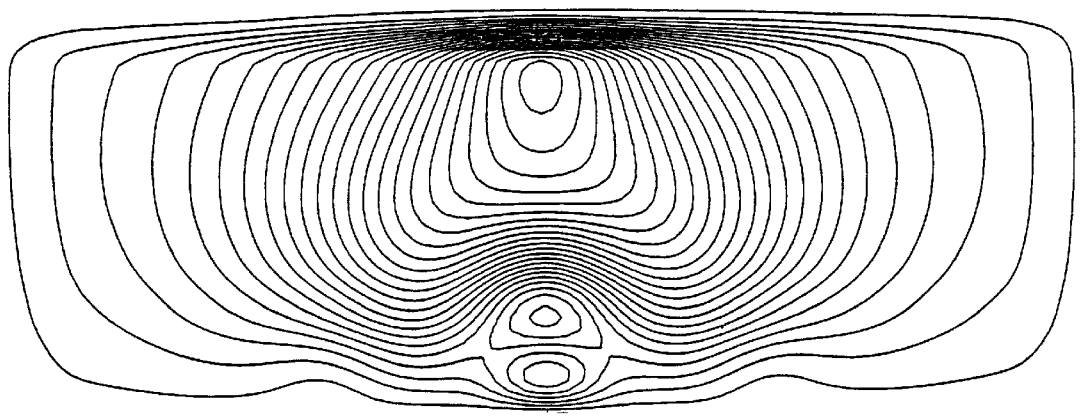
FIGS. 6A and 6B are diagrammatic illustrations of an exemplary second primary symmetric uniplanar z-gradient coil and a second shield coil for a vertical system in accordance with the present invention.
Figure 6B:
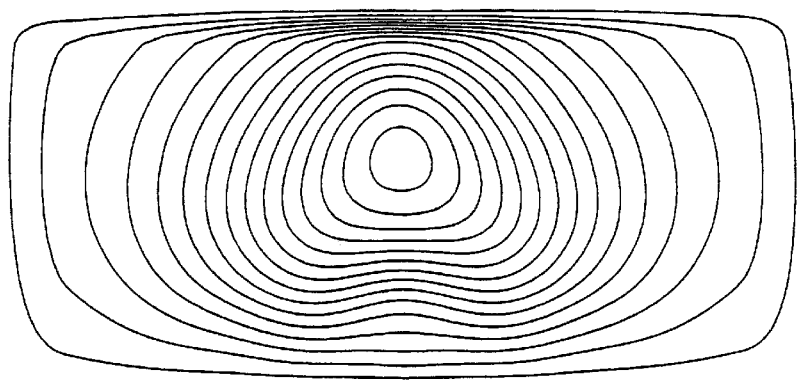
Figure 7:
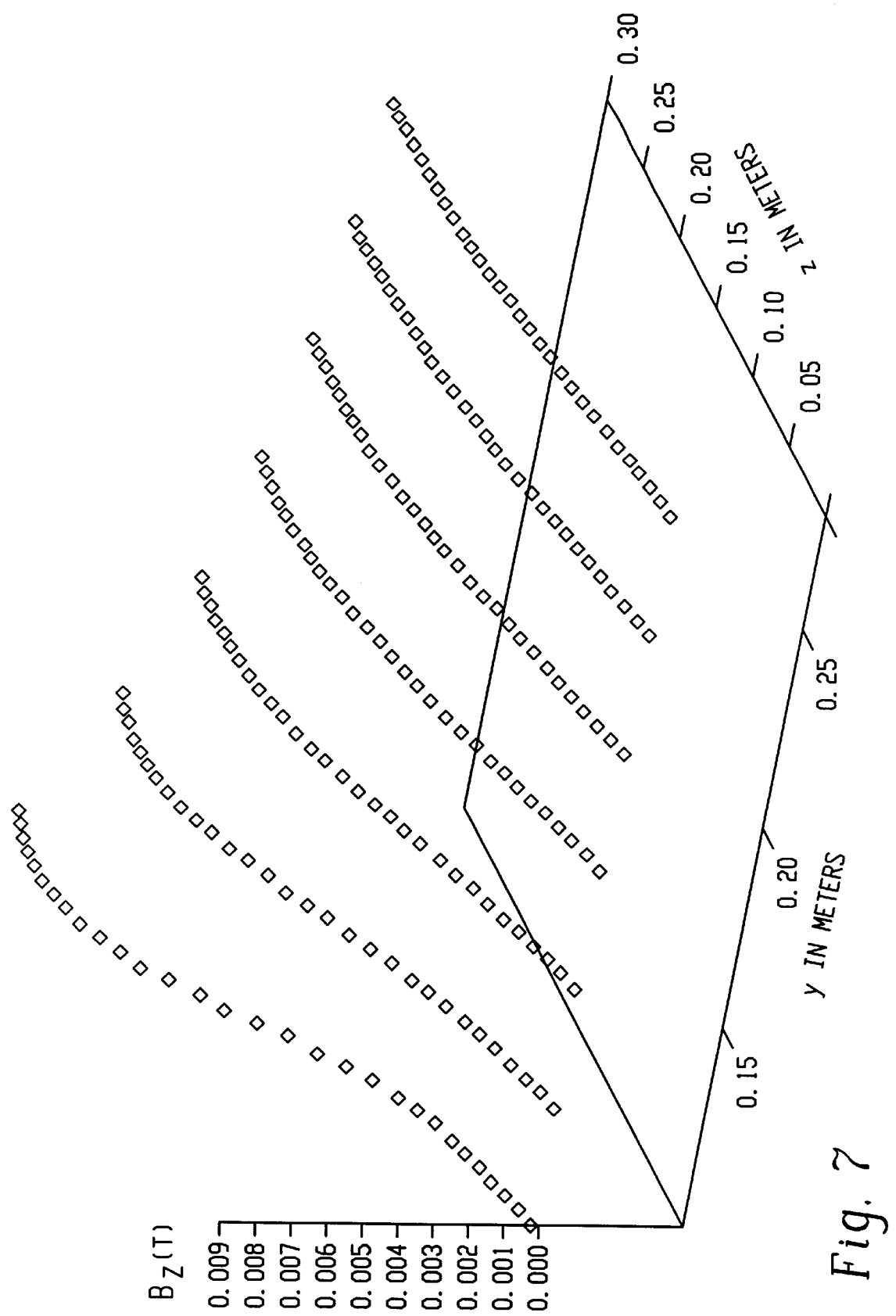
FIG. 7 is a plot of the y-component of the magnetic field along the yz plane at x=0.0 for the second shielded z uniplanar gradient coil for a vertical system in accordance with the present invention.

Employing the stream function technique, the discrete current pattern for the primary coil consisted of 23 discrete loops (FIG. 6A), where each loop carries a constant current of 188.6 Amps. Similarly, the secondary coil's current density can be approximated by 15 loops (FIG. 6B), where each loop carries a constant current of 188.6 Amps. Using the Biot-Savart law, the y component of the magnetic field is evaluated along the yz plane at x=0.0, as shown in FIG. 7. Table 5 shows the electrical characteristics for the second module of the shielded Z uniplanar gradient coil which are designed for main magnets with vertically directed fields. The rise time, slew rates and gradient strengths were evaluated assuming a 400V/330 A gradient amplifier.

TABLE 5

Electrical Characteristics for the Two shielded Z Unipolar Modules

| Property | First Shielded Z Uniplanar module | Second Shielded Z Uniplanar module |
|---|---|---|
| Primary plane location | 0.002 m | 0.006 m |
| Shielding plane location | 0.056 m | 0.050 m |
| Number of discrete loops Primary/Secondary | 17/10 | 23/15 |
| Gradient Strength @ 330 A | 30.46 mT/m | 35 mT/m |
| Linearity at z = ±20 cm | 15.35% | 17.68% |
| Uniformity at y = ±20 cm | 18.5% | 20.92% |
| Inductance in $\mu$H | 346 $\mu$H | 567 $\mu$H |
| Resistance in m$\Omega$ | 115 m$\Omega$ | 185 m$\Omega$ |
| Rise Time in $\mu$sec | 315 $\mu$sec | 552 $\mu$sec |
| Linear Slew | 97 T/m/sec | 63 T/m/sec |

TABLE 5-continued

Electrical Characteristics for the Two shielded Z Unipolar Modules

| Property | First Shielded Z Uniplanar module | Second Shielded Z Uniplanar module |
|---|---|---|
| Rate @ 400 V Sinusoidal Slew Rate @ 400 V | 106 T/m/sec | 76 T/m/sec |

Figure 8:
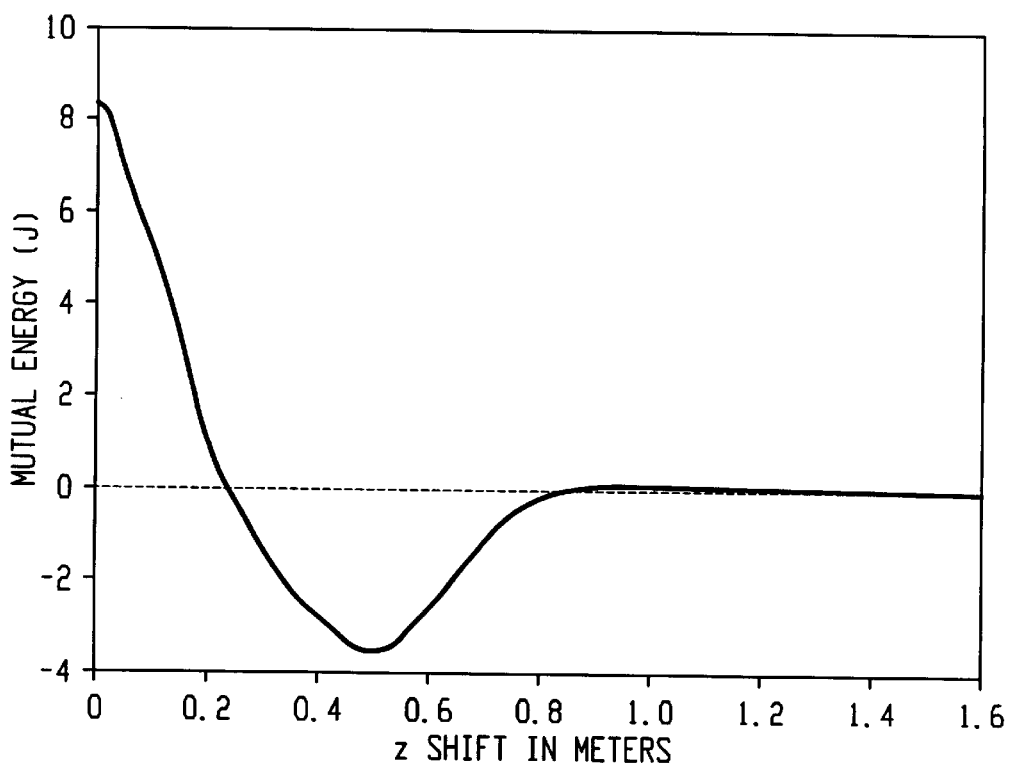
FIG. 8 is a plot of mutual energy vs. z-shift for the first and second symmetric transverse uniplanar gradient coils for a vertical system in accordance with the present invention.

Further, the mutual energy between these two modules was evaluated based on Equation (32). As FIG. 8 indicates, by axially (along z) shifting the first module coil relative to the second one, the mutual energy, and hence the mutual inductance, of these two modules goes through zero when the first module is shifted by z=244 mm away from the second coil module. In this case, there will be no effect to the rise time or slew rate of the combined module system as long as the coils are axially separated by z=244 mm relative to each other. As FIG. 8 also indicates, if the first coil module is placed on top of the second coil module, the mutual energy between these two modules is 8.34 Joules which is almost comparable with the self-energy or either one of the modules. In this case, driving these two coils in series will affect rise time and slew rate significantly.

Figure 9A:
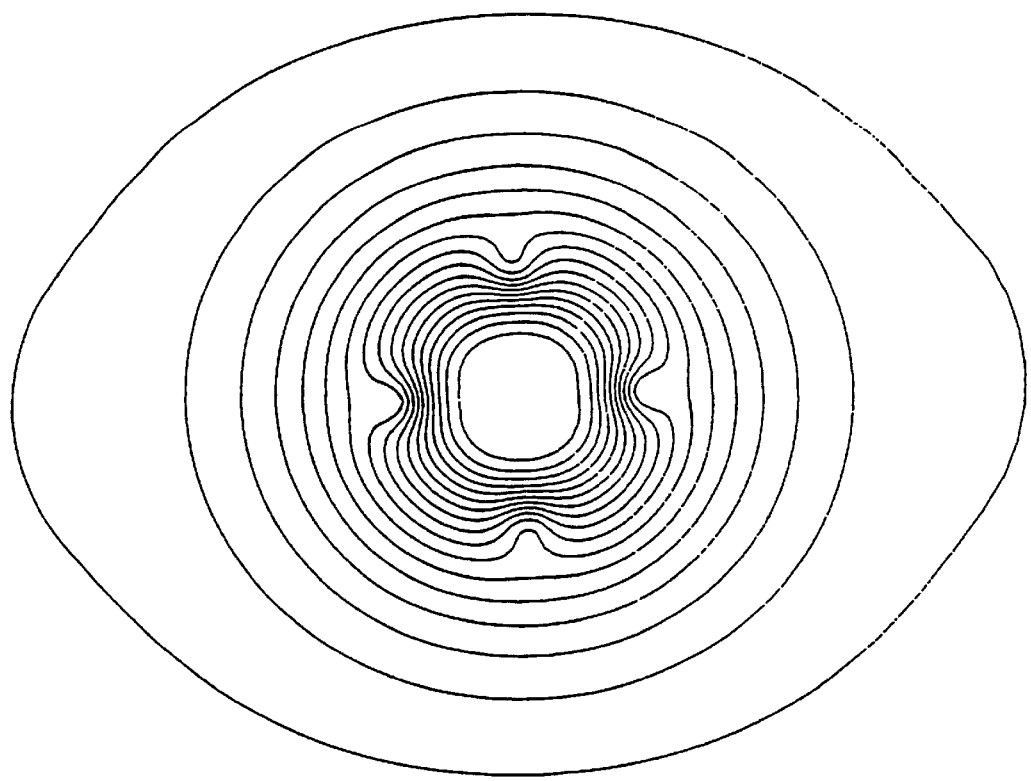
FIGS. 9A and 9B are diagrammatic illustrations of an exemplary first primary symmetric uniplanar y-gradient coil and a corresponding first shield coil for a vertical system in accordance with the present invention.
Figure 9B:
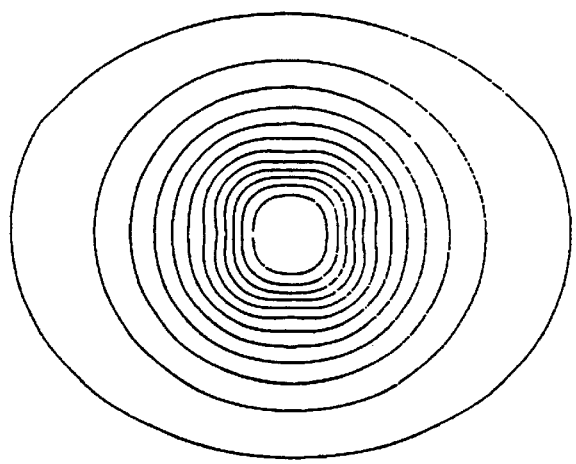

For the first shield y uniplanar module, by employing the stream function technique, the discrete current pattern for the primary coil consists of 15 discrete loops (FIG. 9A) where each loops carries a constant current of 348.51 Amps. Similarly, the secondary coil's current density is approximated by 10 loops (FIG. 9B) where each loop carries a constant current of 348.51 Amps. Table 6 shows the electrical characteristics for the first module of the shielded Y uniplanar gradient coil which is designed for main magnets with vertically directed fields. The rise time, slew rates and gradient strengths were evaluated assuming a 400V/330 A gradient amplifier.

Figure 10A:
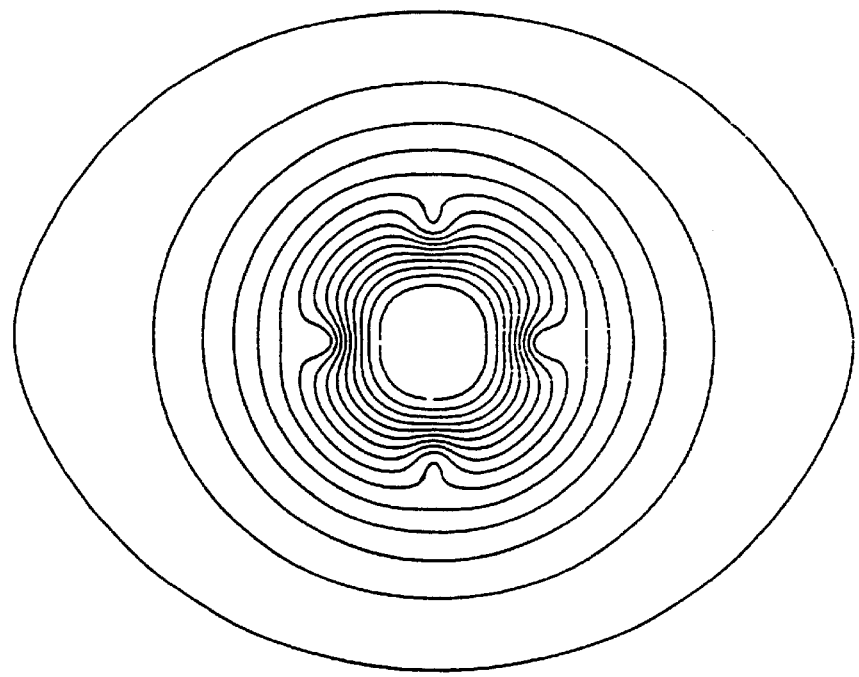
FIGS. 10A and 10B are diagrammatic illustrations of an exemplary second primary symmetric uniplanar y-gradient coil and a corresponding second shield coil for a vertical system in accordance with the present invention.
Figure 10B:
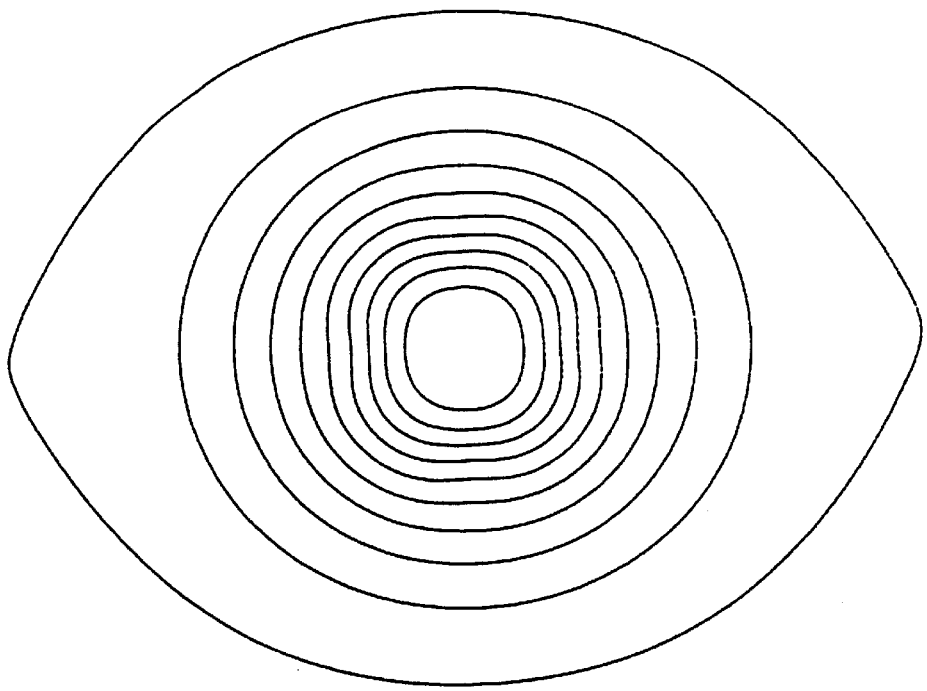

Employing the stream function technique, the discrete current pattern for the second primary Y uniplanar module consists of 17 discrete loops (FIG. 10A) where each loop carries a constant current of 365.39 Amps. Similarly, the secondary coil's current density is approximated by 10 loops (FIG. 10B) where each loop carries a constant current of 365.39 Amps. Table 6 shows the electrical characteristics for the second module of the shielded Y uniplanar gradient coil which is designed for main magnets with vertically directed fields. The rise time, slew rates and gradient strengths were evaluated assuming a 400V/330 A gradient amplifier.

TABLE 6

Electrical Characteristics for the Two shielded Y Uniplanar Modules

| Property | First Shielded Y Uniplanar module | Second Shielded Y Uniplanar module |
|---|---|---|
| Primary plane location | 0.002 m | 0.006 m |
| Shielding plane location | 0.056 m | 0.050 m |
| Number of discrete loops Primary/Secondary | 15/10 | 17/12 |
| Gradient Strength @ 330 A | 19 mT/m | 18 mT/m |
| Linearity at z = ±20 cm | 21.42% | 20.86% |
| Uniformity at y = ±20 cm | 20.01% | 20.42% |
| Inductance in $\mu H$ | 162 $\mu H$ | 184 $\mu H$ |
| Resistance in m$\Omega$ | 115 m$\Omega$ | 175 m$\Omega$ |
| Rise Time in $\mu sec$ | 148 $\mu sec$ | 177 $\mu sec$ |
| Linear Slew Rate @ 400 V | 129 T/m/sec | 101 T/m/sec |
| Sinusoidal Slew Rate @ 400 V | 141 T/m/sec | 117 T/m/sec |

Figure 11:
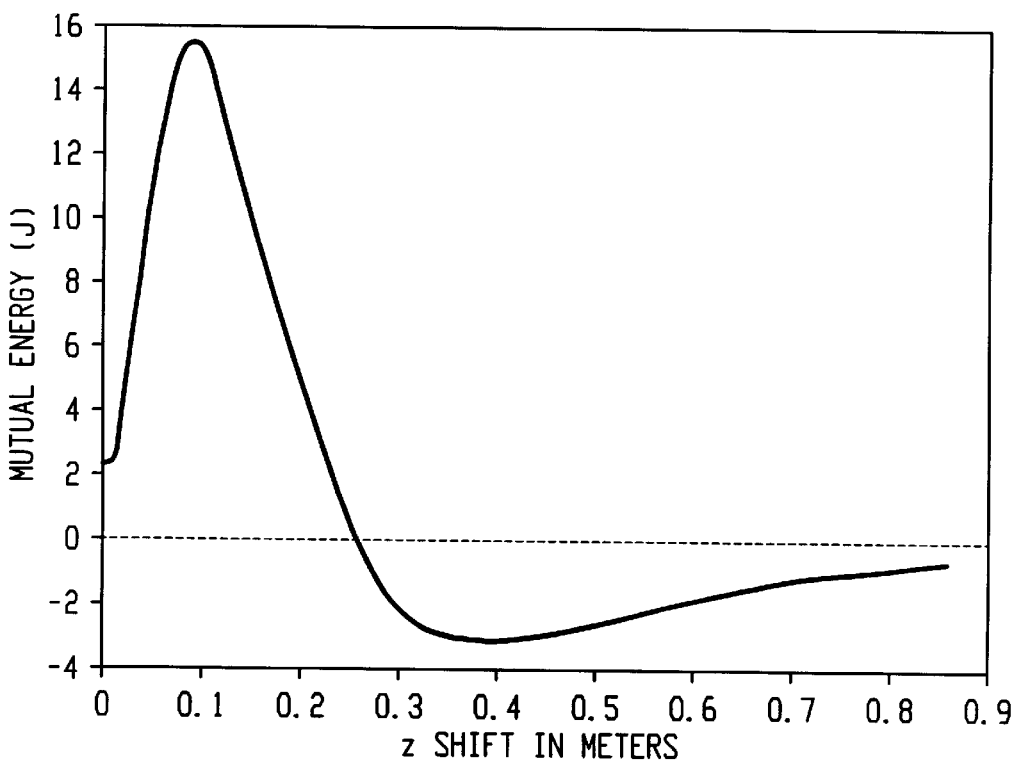
FIG. 11 is a plot of mutual energy vs. z-shift for the first and second symmetric uniplanar y-gradient coils for a vertical system in accordance with the present invention.

Further, the mutual energy between these two modules was evaluated based on Equation (32). As FIG. 11 indicates, by axially (along z) shifting the first module coil relative to the second one, the mutual energy, and hence the mutual inductance, of these two modules goes through zero when the first module is shifted by z=258 mm away from the second coil module. In this case, there will be no effect on the rise time or slew rate of the combined module system as long as the coils are axially separated by z=258 mm relative to each other (FIG. 11).

The non-shielded case, is represented by the above equations where $b \rightarrow \infty$. It is to be appreciated that the uniplanar design may be adapted to a bore-type system with a horizontally directed magnetic field. The development and design for a horizontal system will now be presented. In this case, the main magnetic field is directed along the z-axis.

Considering the plane for the primary coil positioned at y=−a, while the plane for the secondary coil positioned at y=−b, and confining the current density on the xz plane, the expression of the current distribution J(x,z) is:

$$\vec{J}(x,z)=[J_x(x,z)\hat{x}+J_z(x,z)\hat{z}] \qquad (33)$$

Therefore the expressions of the two components $A_x$, $A_z$ of the magnetic vector potential for $y \geq -a$ are:

$$A_x = \frac{\mu_0}{8\pi^2} \int\int_{-\infty}^{+\infty} \frac{d\alpha d\beta}{\sqrt{\alpha^2+\beta^2}} e^{i\alpha x+i\beta z} \qquad (34)$$

$$\left[J_x^{-a}(\alpha,\beta)e^{-\sqrt{\alpha^2+\beta^2}\,(y+a)} + J_x^{-b}(\alpha,\beta)e^{-\sqrt{\alpha^2+\beta^2}\,(y+b)}\right]$$

$$A_z = \frac{\mu_0}{8\pi^2} \int\int_{-\infty}^{+\infty} \frac{d\alpha d\beta}{\sqrt{\alpha^2+\beta^2}} e^{i\alpha x+i\beta z} \qquad (35)$$

$$\left[J_z^{-a}(\alpha,\beta)e^{-\sqrt{\alpha^2+\beta^2}\,(y+a)} + J_z^{-b}(\alpha,\beta)e^{-\sqrt{\alpha^2+\beta^2}\,(y+b)}\right]$$

In addition, the expressions of the two components $A_x$, $A_z$ of the magnetic vector potential for $y \leq -b$ are:

$$A_x = \frac{\mu_0}{8\pi^2} \int\int_{-\infty}^{+\infty} \frac{d\alpha d\beta}{\sqrt{\alpha^2+\beta^2}} e^{i\alpha x+i\beta z} \qquad (36)$$

$$\left[J_x^{-a}(\alpha,\beta)e^{\sqrt{\alpha^2+\beta^2}\,(y+a)} + J_x^{-b}(\alpha,\beta)e^{\sqrt{\alpha^2+\beta^2}\,(y+b)}\right]$$

$$A_z = \frac{\mu_0}{8\pi^2} \int\int_{-\infty}^{+\infty} \frac{d\alpha d\beta}{\sqrt{\alpha^2+\beta^2}} e^{i\alpha x+i\beta z} \qquad (37)$$

$$\left[J_z^{-a}(\alpha,\beta)e^{\sqrt{\alpha^2+\beta^2}\,(y+a)} + J_z^{-b}(\alpha,\beta)e^{\sqrt{\alpha^2+\beta^2}\,(y+b)}\right]$$

where $J_{(x,z)}(\alpha,\beta)$ represents the double Fourier transform of the $J_{(x,z)}(x,z)$ components of the current density, respectively. Considering the current continuity equation ($\bar{\nabla} \cdot J = 0$), the relationship for these two components of the current density in the Fourier domain is:

$$J_z(\alpha, \beta) = -\frac{\alpha}{\beta} J_x(\alpha, \beta) \tag{38}$$

In this case, Equations (35) and (37) have the form:

$$A_z = \frac{\mu_0}{8\pi^2} \int\int_{-\infty}^{+\infty} \frac{d\alpha d\beta}{\sqrt{\alpha^2 + \beta^2}} e^{i\alpha x + i\beta z}\left(-\frac{\alpha}{\beta}\right) \tag{39}$$
$$\left[J_x^{-a}(\alpha, \beta)e^{-\sqrt{\alpha^2+\beta^2}\,(y+a)} + J_x^{-b}(\alpha, \beta)e^{-\sqrt{\alpha^2+\beta^2}\,(y+b)}\right]$$
$$\text{for } y \geq -a$$

$$A_z = \frac{\mu_0}{8\pi^2} \int\int_{-\infty}^{+\infty} \frac{d\alpha d\beta}{\sqrt{\alpha^2 + \beta^2}} e^{i\alpha x + i\beta z}\left(-\frac{\alpha}{\beta}\right) \tag{40}$$
$$\left[J_x^{-a}(\alpha, \beta)e^{\sqrt{\alpha^2+\beta^2}\,(y+a)} + J_x^{-b}(\alpha, \beta)e^{\sqrt{\alpha^2+\beta^2}\,(y+b)}\right]$$
$$\text{for } y \leq -b$$

Furthermore, the expressions of the two components for magnetic vector potential at the surfaces of the two planes (y=−a, and y=−b) have the form:

$$A_x = \frac{\mu_0}{8\pi^2} \int\int_{-\infty}^{+\infty} \frac{d\alpha d\beta}{\sqrt{\alpha^2 + \beta^2}} e^{i\alpha x + i\beta z} \tag{41}$$
$$\left[J_x^{-a}(\alpha, \beta) + J_x^{-b}(\alpha, \beta)e^{-\sqrt{\alpha^2+\beta^2}\,(b-a)}\right] \text{ for } y = -a$$

$$A_z = \frac{\mu_0}{8\pi^2} \int\int_{-\infty}^{+\infty} \frac{d\alpha d\beta}{\sqrt{\alpha^2 + \beta^2}} e^{i\alpha x + i\beta z}\left(-\frac{\alpha}{\beta}\right) \tag{42}$$
$$\left[J_x^{-a}(\alpha, \beta) + J_x^{-b}(\alpha, \beta)e^{-\sqrt{\alpha^2+\beta^2}\,(b-a)}\right] \text{ for } y = -a$$

$$A_x = \frac{\mu_0}{8\pi^2} \int\int_{-\infty}^{+\infty} \frac{d\alpha d\beta}{\sqrt{\alpha^2 + \beta^2}} e^{i\alpha x + i\beta z} \tag{43}$$
$$\left[J_x^{-a}(\alpha, \beta)e^{-\sqrt{\alpha^2+\beta^2}\,(b-a)} + J_x^{-b}(\alpha, \beta)\right] \text{ for } y = -b$$

$$A_z = \frac{\mu_0}{8\pi^2} \int\int_{-\infty}^{+\infty} \frac{d\alpha d\beta}{\sqrt{\alpha^2 + \beta^2}} e^{i\alpha x + i\beta z}\left(-\frac{\alpha}{\beta}\right) \tag{44}$$
$$\left[J_x^{-a}(\alpha, \beta)e^{-\sqrt{\alpha^2+\beta^2}\,(b-a)} + J_x^{-b}(\alpha, \beta)\right] \text{ for } y = -b$$

The expression for the component of the gradient field coincidental with the direction of the main magnetic field is $B_z$, and has the following form:

$$B_z = -\partial_y A_x \Rightarrow$$

$$B_z = \frac{\mu_0}{8\pi^2} \int\int_{-\infty}^{+\infty} d\alpha d\beta e^{i\alpha x + i\beta z} \tag{45}$$
$$\left[J_x^{-a}(\alpha, \beta)e^{-\sqrt{\alpha^2+\beta^2}\,(y+a)} + J_x^{-b}(\alpha, \beta)e^{-\sqrt{\alpha^2+\beta^2}\,(y+b)}\right]$$
$$\text{for } y \geq -a$$

$$B_z = -\frac{\mu_0}{8\pi^2} \int\int_{-\infty}^{+\infty} d\alpha d\beta e^{i\alpha x + i\beta z} \tag{46}$$
$$\left[J_x^{-a}(\alpha, \beta)e^{\sqrt{\alpha^2+\beta^2}\,(y+a)} + J_x^{-b}(\alpha, \beta)e^{\sqrt{\alpha^2+\beta^2}\,(y+b)}\right]$$
$$\text{for } y \leq -b$$

Considering the shielding requirements $B_z=0$ at y=−b, Equation (46) relates the current densities for the two planes as:

$$J_x^{-b}(\alpha\beta) = -e^{\sqrt{\alpha^2+\beta^2}\,(b-a)} J_x^{-a}(\alpha,\beta) \tag{47}$$

and Equation (45) becomes:

$$B_z = \frac{\mu_0}{8\pi^2} \int\int_{-\infty}^{+\infty} d\alpha d\beta e^{i\alpha x + i\beta z} e^{-\sqrt{\alpha^2+\beta^2}\,(y+a)} J_x^{-a}(\alpha, \beta) \tag{48}$$
$$\left[1 - e^{-2\sqrt{\alpha^2+\beta^2}\,(b-a)}\right] \text{ for } y \geq -a$$

In addition, the stored magnetic energy of the coil is given by Equation (48a) as:

$$W_m = \frac{1}{2}\int_v d^3x \quad \vec{A} \cdot \vec{J} \Rightarrow$$

$$W_m = \frac{\mu_0}{16\pi^2} \int\int_{-\infty}^{+\infty} d\alpha d\beta \frac{\sqrt{\alpha^2+\beta^2}}{\beta^2} |J_x^{-a}(\alpha, \beta)|^2 \tag{48a}$$
$$\left[1 - e^{-2\sqrt{\alpha^2+\beta^2}\,(b-a)}\right]$$

In this section, the theoretical development for the transverse uniplanar shielded gradient coil will be presented. Specifically, the Y gradient coil will be presented in its entirety.

The non-shielded case is represented by the above equations, where $b \to \infty$. For the Y gradient coil, the z component of the gradient field is symmetric along the z and x directions. In this case, Equation (48) becomes:

$$B_z = \frac{\mu_0}{8\pi^2} \int\int_{-\infty}^{+\infty} d\alpha d\beta \cos(\alpha x)\cos(\beta z) e^{-\sqrt{\alpha^2+\beta^2}\,(y+a)} \tag{49}$$
$$J_x^{-a}(\alpha, \beta)\left[1 - e^{-2\sqrt{\alpha^2+\beta^2}\,(b-a)}\right] \text{ for } y \geq -a$$

which leads to the expression of the Fourier transform for the $J_x^{-a}(\alpha,\beta)$ as:

$$J_x^{-a}(\alpha, \beta) = 4\int\int_0^{+\infty} dx dz \cos(\alpha x)\cos(\beta z) J_x^{-a}(x, z) \tag{50}$$

Based on the energy minimization mechanism, the functional E is constructed in terms of the magnetic field and the stored magnetic energy as:

$$E(J_x^{-a}) = W_m - \sum_{j=1}^N \lambda_j [B_z(\vec{r}_j) - B_{zSC}(\vec{r}_j)] \tag{50a}$$

where $\lambda_j$ are the Lagrange multipliers, $B_z(r_j)$ is the calculated value of the magnetic field at the constraint points $r_j$ and $B_{zSC}(r_j)$ are the constraint values of the magnetic field at the constraint points.

Minimizing E with respect to the current density $J_x^{-a}$, a matrix Equation for $J_x^{-a}$ is:

$$J_x^{-a} = \frac{\beta^2}{\sqrt{\alpha^2+\beta^2}} \sum_{j=1}^N \lambda_j \cos(\alpha x_j)\cos(\beta z_j) e^{-\sqrt{\alpha^2+\beta^2}\,(y_j+a)} \tag{51}$$

where the Lagrange multipliers $\lambda_j$ are determined via the constraint equation:

$$\sum_{j=1}^N C_{ij}\lambda_j = B_{zSC_i} \quad \text{with}$$

$$C_{ij} = \frac{\mu_0}{2\pi^2} \int\int_0^{+\infty} d\alpha d\beta \cos(\alpha x_i)\cos(\beta z_i) e^{-\sqrt{\alpha^2+\beta^2}\,(y_i+a)} \quad (52)$$

$$\sum_{j=1}^{N} \frac{\beta^2}{\sqrt{\alpha^2+\beta^2}} \lambda_j \cos(\alpha x_j)\cos(\beta z_j) e^{-\sqrt{\alpha^2+\beta^2}\,(y_j+a)}$$

$$\left[1 - e^{-2\sqrt{\alpha^2+\beta^2}\,(b-a)}\right]$$

Upon determination of the Lagrange multipliers the continuous current density distribution for $J_x^{-a}$ and $J_z^{-a}$ components of the current density are generated. For the shielding coil, its current density is derived by determining the current density of the primary coil via Equation (52) and subsequently applying the inverse transform to Equation (47). Upon determination of the continuous current densities for both coils, their associated discrete current patterns, which are very close approximations for the continuous current densities, can be generated by applying the stream function technique. In order to ensure the integrity of the discretization process, the magnetic field is re-evaluated inside and outside the imaging volume by applying the Biot-Savart formula to both discrete current distributions.

For the X gradient coil, the z component of the gradient field must be symmetric along the z and y directions while it must be anti-symmetric along the x direction. In this case, Equation (48) becomes:

$$B_z = -\frac{\mu_0}{8\pi^2} \int\int_{-\infty}^{+\infty} d\alpha d\beta \sin(\alpha x)\cos(\beta z) e^{-\sqrt{\alpha^2+\beta^2}\,(y+a)} \quad (53)$$

$$\hat{J}_x^{-a}(\alpha,\beta)\left[1 - e^{-2\sqrt{\alpha^2+\beta^2}\,(b-a)}\right] \quad \text{for } y \geq -a$$

which leads to the expression of the Fourier transform for the $J_x^{-a}(\alpha,\beta)$ as:

$$J_x^{-a}(\alpha,\beta) = i\hat{J}_x^{-a}(\alpha,\beta) \quad \text{and} \quad (54)$$

$$\hat{J}_x^{-a}(\alpha,\beta) = 4\int\int_0^{+\infty} dx dz \sin(\alpha x)\cos(\beta z) J_x^{-a}(x,y)$$

Based on the energy minimization mechanism, the functional E is constructed in terms of the magnetic field and the stored magnetic energy as:

$$E(\hat{J}_x^{-a}) = W_m - \sum_{j=1}^{N} \lambda_j [B_z(\vec{r}_j) - B_{zSC}(\vec{r}_j)] \quad (54a)$$

where $\lambda_j$ are the Lagrange multipliers, $B_z(r_j)$ is the calculated value of the magnetic field at the constraint points $r_j$ and $B_{zSC}(r_j)$ are the constraint values of the magnetic field at the constraint points.

Minimizing E with respect to the current density $\hat{J}_x^{-a}$, the matrix equation for $\hat{J}_x^{-a}$ is:

$$\hat{J}_x^{-a} = -\frac{\beta^2}{\sqrt{\alpha^2+\beta^2}} \sum_{j=1}^{N} \lambda_j \sin(\alpha x_j)\cos(\beta z_j) e^{-\sqrt{\alpha^2+\beta^2}\,(y_j+a)} \quad (55)$$

where the Lagrange multipliers $\lambda_j$ are determined via the constraint equation:

$$\sum_{j=1}^{N} C_{ij}\lambda_j = B_{zSC_i} \quad \text{with}$$

$$C_{ij} = \frac{\mu_0}{2\pi^2} \int\int_0^{+\infty} d\alpha d\beta \sin(\alpha x_i)\cos(\beta z_i) e^{-\sqrt{\alpha^2+\beta^2}\,(y_i+a)} \quad (56)$$

$$\sum_{j=1}^{N} \frac{\beta^2}{\sqrt{\alpha^2+\beta^2}} \lambda_j \sin(\alpha x_j)\cos(\beta z_j) e^{-\sqrt{\alpha^2+\beta^2}\,(y_j+a)}$$

$$\left[1 - e^{-2\sqrt{\alpha^2+\beta^2}\,(b-a)}\right]$$

Upon determination of the Lagrange multipliers the continuous current density distribution for $J_x^{-a}$ and $J_z^{-a}$ components of the current density are generated. For the shielding coil, its current density can be derived by determining the current density of the primary coil via Equation (56) and subsequently applying the inverse transform to Equation (47). Upon determination of the continuous current densities for both coils, their associated discrete current patterns which is a very close approximation for the continuous current density can be generated by applying the stream function technique. In order to ensure the integrity of the discretization process, the magnetic field is re-evaluated inside and outside the imaging volume by applying the Biot-Savart formula to both discrete current distributions.

In this section, the theoretical development for the axial uniplanar shielded gradient coil will be presented. For the Z gradient coil, the z component of the gradient field must be symmetric along the x and y directions. In this case, Equation (48) becomes:

$$B_z = -\frac{\mu_0}{8\pi^2} \int\int_{-\infty}^{+\infty} d\alpha d\beta \cos(\alpha x)\sin(\beta z) e^{-\sqrt{\alpha^2+\beta^2}\,(y+a)} \quad (57)$$

$$\hat{J}_x^{-a}(\alpha,\beta)\left[1 - e^{-2\sqrt{\alpha^2+\beta^2}\,(b-a)}\right] \quad \text{for } y \geq -a$$

which leads to the expression of the Fourier transform for the $J_x^{-a}(\alpha,\beta)$ as:

$$J_x^{-a}(\alpha,\beta) = i\hat{J}_x^{-a}(\alpha,\beta) \quad \text{and} \quad (58)$$

$$\hat{J}_x^{-a}(\alpha,\beta) = 4\int\int_0^{+\infty} dx dz \cos(\alpha x)\sin(\beta z) J_x^{-a}(x,z)$$

Based on the energy minimization mechanism, the functional E is constructed in terms of the magnetic field and the stored magnetic energy as:

$$E(\hat{J}_x^{-a}) = W_m - \sum_{j=1}^{N} \lambda_j [B_z(\vec{r}_j) - B_{zSC}(\vec{r}_j)] \quad (58a)$$

where $\lambda_j$ are the Lagrange multipliers, $B_z(r_j)$ is the calculated value of the magnetic field at the constraint points $r_j$ and $B_{zSC}(r_j)$ are the constraint values of the magnetic field at the constraint points.

Minimizing E with respect to the current density $\hat{J}_x^{-a}$, the matrix equation for $\hat{J}_x^{-a}$ is:

$$\hat{J}_x^{-a} = -\frac{\beta^2}{\sqrt{\alpha^2+\beta^2}} \sum_{j=1}^{N} \lambda_j \cos(\alpha x_j)\sin(\beta z_j) e^{-\sqrt{\alpha^2+\beta^2}\,(y_j+a)} \quad (59)$$

where the Lagrange multipliers $\lambda_j$ are determined via the constraint Equation:

$$\sum_{j=1}^{N} C_{ij}\lambda_j = B_{zSC_i} \quad \text{with}$$

$$C_{ij} = \frac{\mu_0}{2\pi^2} \int\int_0^{+\infty} d\alpha d\beta \cos(\alpha x_i)\sin(\beta z_i)e^{-\sqrt{\alpha^2+\beta^2}\,(y_i+a)} \quad (60)$$

$$\sum_{j=1}^{N} \frac{\beta^2}{\sqrt{\alpha^2+\beta^2}} \lambda_j \cos(\alpha x_j)\sin(\beta z_j)e^{-\sqrt{\alpha^2+\beta^2}\,(y_j+a)}$$

$$\left[1 - e^{-2\sqrt{\alpha^2+\beta^2}\,(b-a)}\right]$$

Upon determination of the Lagrange multipliers, the continuous current density distribution for $J_x^{-a}$ and $J_z^{-a}$ components of the current density are generated. For the shielding coil, its current density can be derived by determining the current density of the primary coil via Equation (60) and subsequently applying the inverse transform to Equation (47). Upon determination of the continuous current densities for both coils, their associated discrete current patterns, which are very close approximations of the continuous current density, can be generated by applying the stream function technique. In order to ensure the integrity of the discretization process, the magnetic field is re-evaluated inside and outside the imaging volume by applying the Biot-Savart formula to both discrete current distributions.

For the first shielded Z uniplanar module, the positions of the two planes for the primary and secondary coils are at y=−a'=−0.006 m and y=−b'=−0.03170 m, respectively. Five constraint points define the characteristics of the field inside an imaging volume. The first three constraint points define a gradient strength of 20 mT/m inside the imaging volume with a 9% on-axis linearity. Three constraint points along the gradient axis are used to contain the on-axis non-linearity of the gradient coil in acceptable levels. The uniformity of the gradient field inside this imaging volume is restricted to less than 15% from its actual value. This set of constraints is displayed in Table 7.

TABLE 7

Constraints for the first Z shielded Uniplanar module

| j | $X_j$ in mm | $Y_j$ in mm | $Z_j$ in mm | $B_{zsc}$ in mTesla |
|---|---|---|---|---|
| 1 | 0.0 | 0.000 | 1.000 | 0.0200 |
| 2 | 0.0 | 0.000 | 100.0 | 2.0000 |
| 3 | 0.0 | 0.000 | 320.0 | 5.8400 |
| 4 | 180.0 | 0.000 | 1.000 | 0.0190 |
| 5 | 0.0 | 200.0 | 1.000 | 0.0170 |

For the second shielded Z uniplanar module, the positions of the two planes for the primary and secondary coils are at y=−a=−0.003 m and y=−b=−0.03355 m, respectively. Five constraint points define the characteristics of the field inside an imaging volume. The first three constraint points define a gradient strength of 30 mT/m inside the imaging volume with a 15% on-axis linearity. Three constraint points along the gradient axis are used to contain the on-axis non-linearity of the gradient coil in acceptable levels. The uniformity of the gradient field inside this imaging volume is restricted to less than 27% from its actual value. This set of constraints is displayed in Table 8.

TABLE 8

Constraints for the second Z shielded Uniplanar module

| j | $X_j$ in mm | $Y_j$ in mm | $Z_j$ in mm | $B_{zsc}$ in mTesla |
|---|---|---|---|---|
| 1 | 0.0 | 0.0 | 1.000 | 0.0300 |
| 2 | 0.0 | 0.0 | 100.0 | 3.0000 |
| 3 | 0.0 | 0.0 | 320.0 | 8.1400 |
| 4 | 180.0 | 0.0 | 1.000 | 0.0290 |
| 5 | 0.0 | 200.0 | 1.000 | 0.0220 |

For the first shielded Y uniplanar module, the positions of the two planes for the primary and secondary coils are at y=−a'=−0.006 m and y=−b'=−0.03272 m, respectively. Four constraint points define the characteristics of the field inside an imaging volume. The first two constraint points define a gradient strength of 20 mT/m inside the imaging volume with a 5% on-axis linearity. Two constraint points along the gradient axis are used to contain the on-axis non-linearity of the gradient coil in acceptable levels. The uniformity of the gradient field inside this imaging volume is restricted to less than 22.5% from its actual value inside a 40 cm DSV volume. This set of constraints is displayed in Table 9.

TABLE 9

Constraints for the first Y shielded Uniplanar module

| j | $X_j$ in mm | $Y_j$ in mm | $Z_j$ in mm | $B_{zsc}$ in mTesla |
|---|---|---|---|---|
| 1 | 0.0 | 1.0 | 0.000 | 0.0200 |
| 2 | 0.0 | 180.0 | 0.000 | 3.440 |
| 3 | 0.0 | 1.0 | 200.0 | 0.0155 |
| 4 | 180.0 | 1.0 | 0.000 | 0.0180 |

For the second shielded Y uniplanar module, the positions of the two planes for the primary and secondary coils are at y=−a=−0.003 m and y=−b=−0.03712 m, respectively. Four constraint points define the characteristics of the field inside an imaging volume. The first two constraint points define a gradient strength of 30 mT/m inside the imaging volume with a 6% on-axis linearity. Two constraint points along the gradient axis are used to contain the on-axis non-linearity of the gradient coil in acceptable levels. The uniformity of the gradient field inside this imaging volume is restricted to less than 22% from its actual value inside a 40 cm DSV. This set of constraints is displayed in Table 10.

TABLE 10

Constraints for the second Y shielded Uniplanar module

| j | $X_j$ in mm | $Y_j$ in mm | $Z_j$ in mm | $B_{zsc}$ in mTesla |
|---|---|---|---|---|
| 1 | 0.0 | 1.0 | 0.000 | 0.0300 |
| 2 | 0.0 | 150.0 | 0.000 | 4.240 |
| 3 | 0.0 | 1.0 | 200.0 | 0.0235 |
| 4 | 180.0 | 1.0 | 0.000 | 0.0260 |

Figure 12A:
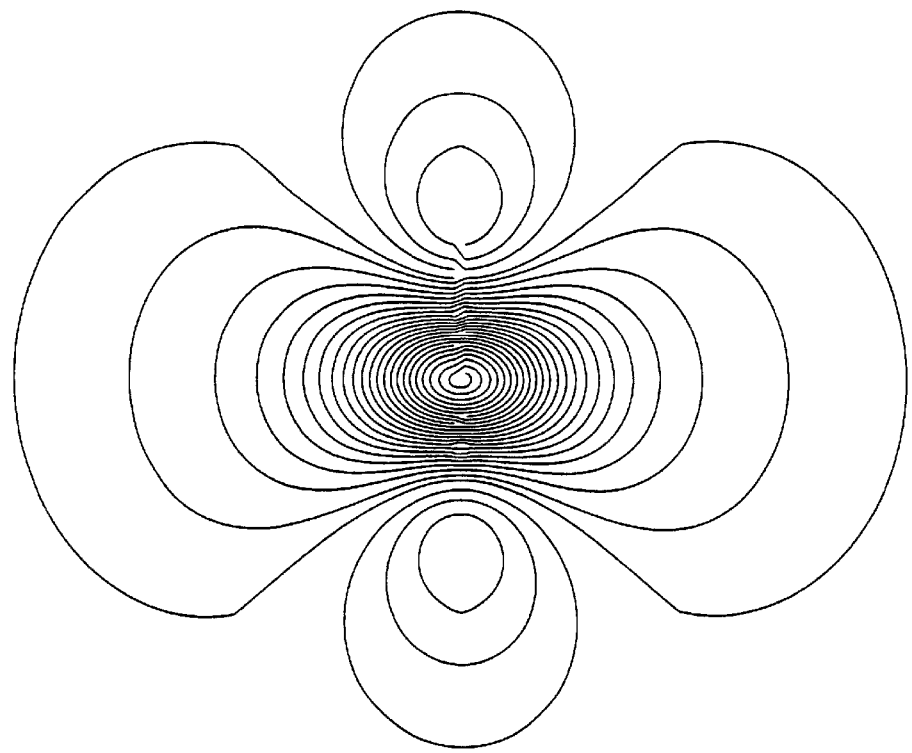
FIGS. 12A and 12B are diagrammatic illustrations of an exemplary first primary symmetric uniplanar z-gradient coil and a first shield coil for a horizontal system in accordance with the present invention.
Figure 12B:
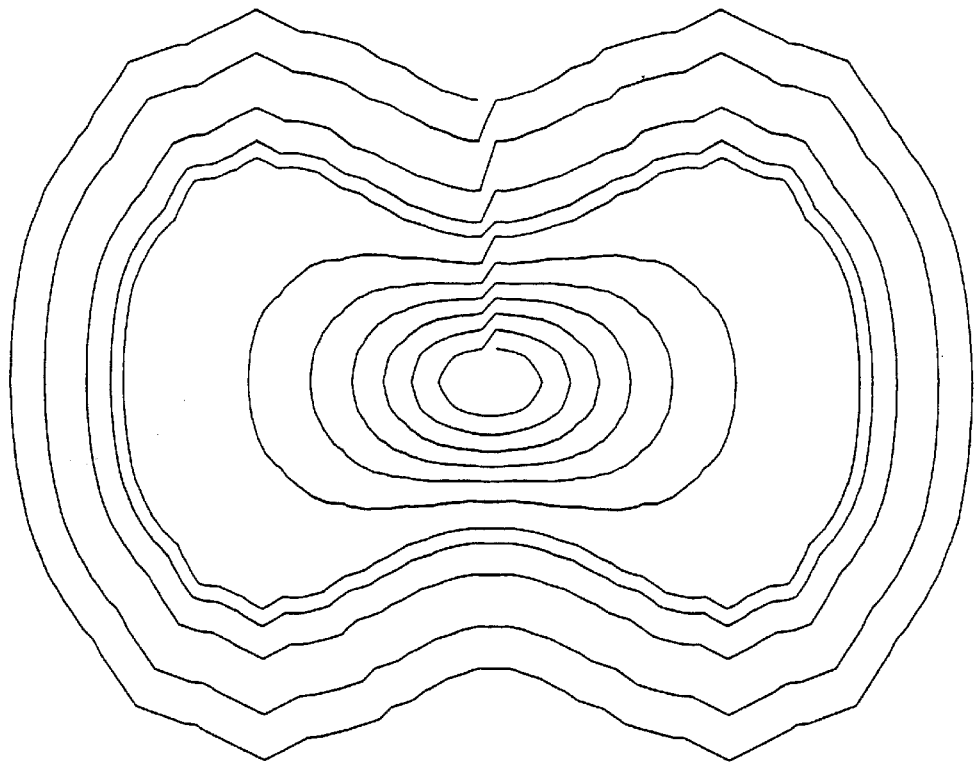

For the first shield z uniplanar module, by employing the stream function technique, the discrete current pattern for the primary coil is comprised of 22 positive and 3 negative discrete loops (FIG. 12A) where each loop carries a constant current of 211.43 Amps. Similarly, the secondary coil's current density is approximated by 13 loops (FIG. 12B) where each loop carries a constant current of 211.43 Amps. Table 11 shows the electrical characteristics for the first module of the shielded Z uniplanar gradient coil which is designed for main magnets with horizontally directed fields. The rise time, slew rates and gradient strengths were evaluated assuming a 400V/330 A gradient amplifier.

Figure 13A:
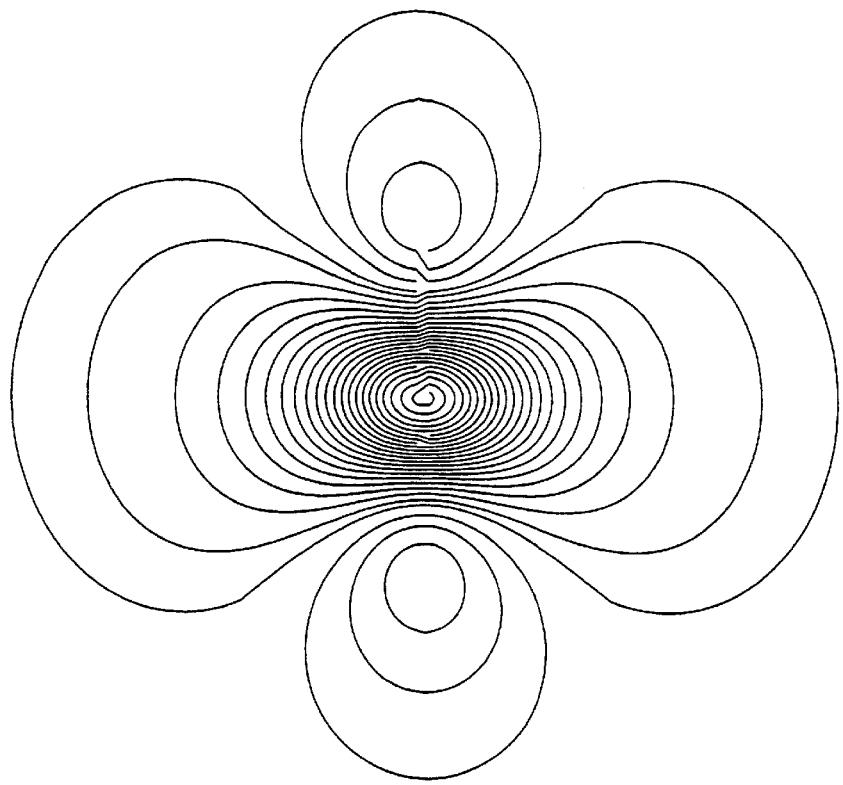
FIGS. 13A and 13B are diagrammatic illustrations of an exemplary second primary symmetric uniplanar z-gradient coil and a second shield coil for a horizontal system in accordance with the present invention.
Figure 13B:
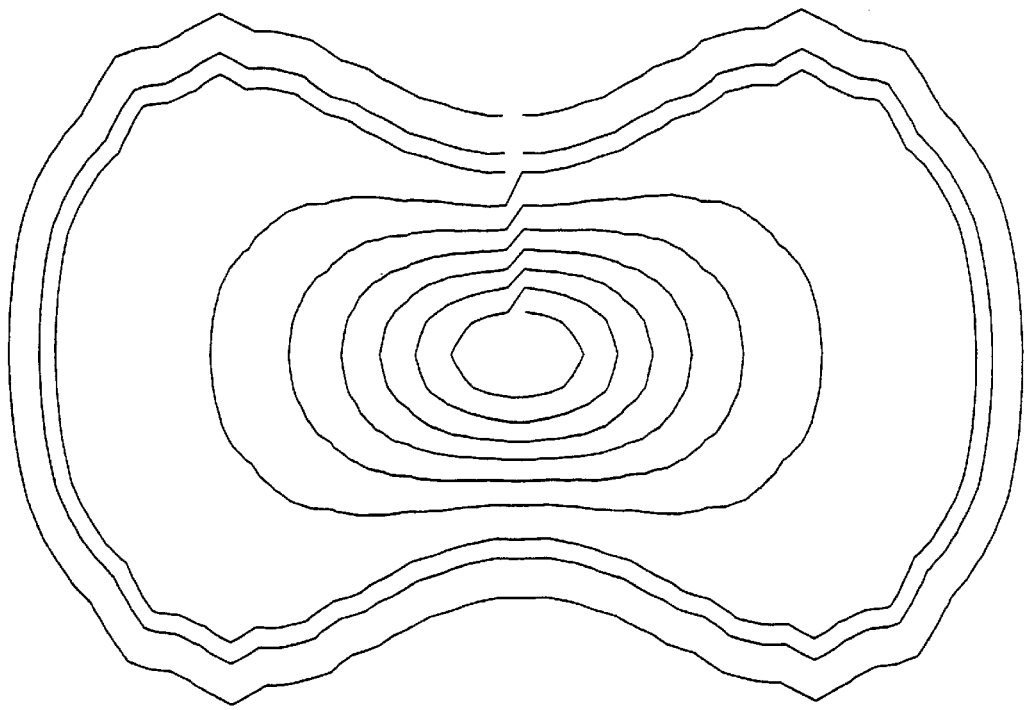

For the second shield Z uniplanar module the stream function technique leads to a discrete current pattern for the primary coil comprised of 21 discrete positive and 3 negative loops (FIG. 13A) where each loop carries a constant current of 248.6 Amps. Similarly, the secondary coil's current density is approximated by 9 loops (FIG. 13B) where each loop carries a constant current of 248.6 Amps. Table 11 shows the electrical characteristics for the second module of the shielded Z uniplanar gradient coil which is designed for main magnets with horizontally directed fields. The rise time, slew rates and gradient strengths were evaluated assuming a 400V/330 A gradient amplifier.

TABLE 11

Electrical Characteristics for the two shielded Z Uniplanar Modules

| Property | First Shielded Z Uniplanar module | Second Shielded Z Uniplanar module |
|---|---|---|
| Primary plane location | 0.006 m | 0.003 m |
| Shielding plane location | 0.0321 m | 0.03355 m |
| Number of discrete loops Primary/Secondary | 22/13 | 21/9 |
| Gradient Strength @ 330 A | 31.2 mT/m | 39.8 mT/m |
| Linearity at $z = \pm 20$ cm | 5.68% | 6.96% |
| Uniformity at $y = \pm 20$ cm | 21.76% | 28.4% |
| Inductance in $\mu H$ | 190 $\mu H$ | 191 $\mu H$ |
| Resistance in m$\Omega$ | 145 m$\Omega$ | 105 m$\Omega$ |
| Rise Time in $\mu sec$ | 178 $\mu sec$ | 173 $\mu sec$ |
| Linear Slew Rate @ 400 V | 175 T/m/sec | 230 T/m/sec |
| Sinusoidal Slew Rate @ 400 V | 198 T/m/sec | 252 T/m/sec |

Figure 14:
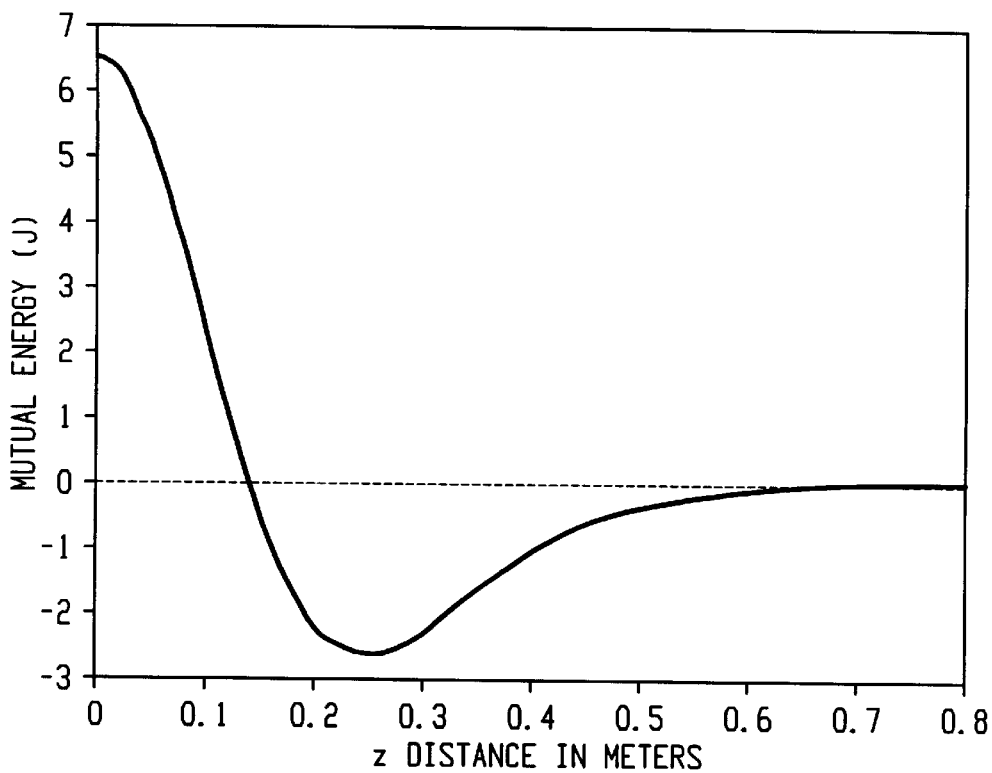
FIG. 14 is a plot of mutual energy vs. z-shift for the first and second symmetric uniplanar z-gradient coils for a horizontal system in accordance with the present invention.

Further, the mutual energy between the first and second modules was evaluated based on Equation (32). As FIG. 14 indicates, by axially shifting (along z) the first module coil relative to the second one, the mutual energy, and hence, the mutual inductance of these two modules, goes through zero when the first module is shifted by z=140 mm from the second coil module. In this case, there will be no effect on the rise time or slew rate of the combined module system as long as the coils are axially separated by z=140 mm relative to each other. As FIG. 14 also indicates, if the first coil module is placed on top of the second coil module, the mutual energy between these two modules is 6.54 Joules, which is comparable with the self-energy of either one of the modules. Driving these two coils in series has significant effects on rise time and slew rate.

Figure 15A:
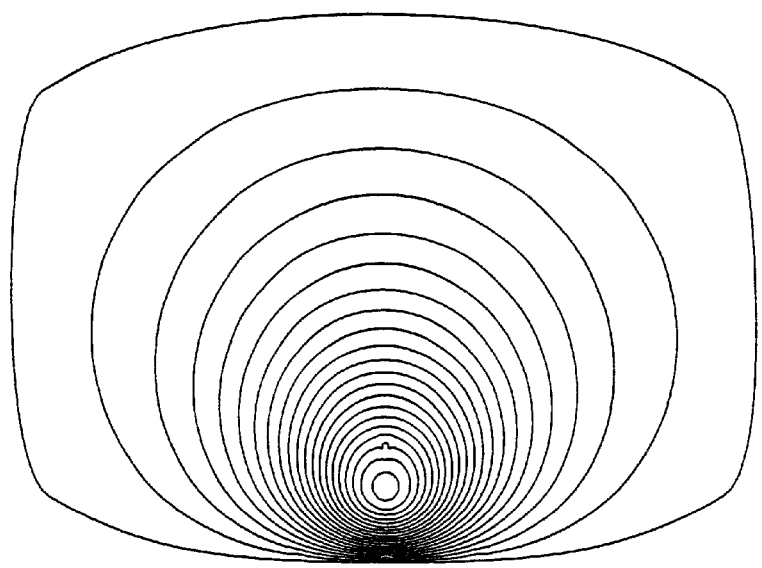
FIGS. 15A and 15B are diagrammatic illustrations of an exemplary first primary symmetric uniplanar y-gradient coil and a first shield coil for a horizontal system in accordance with the present invention.
Figure 15B:
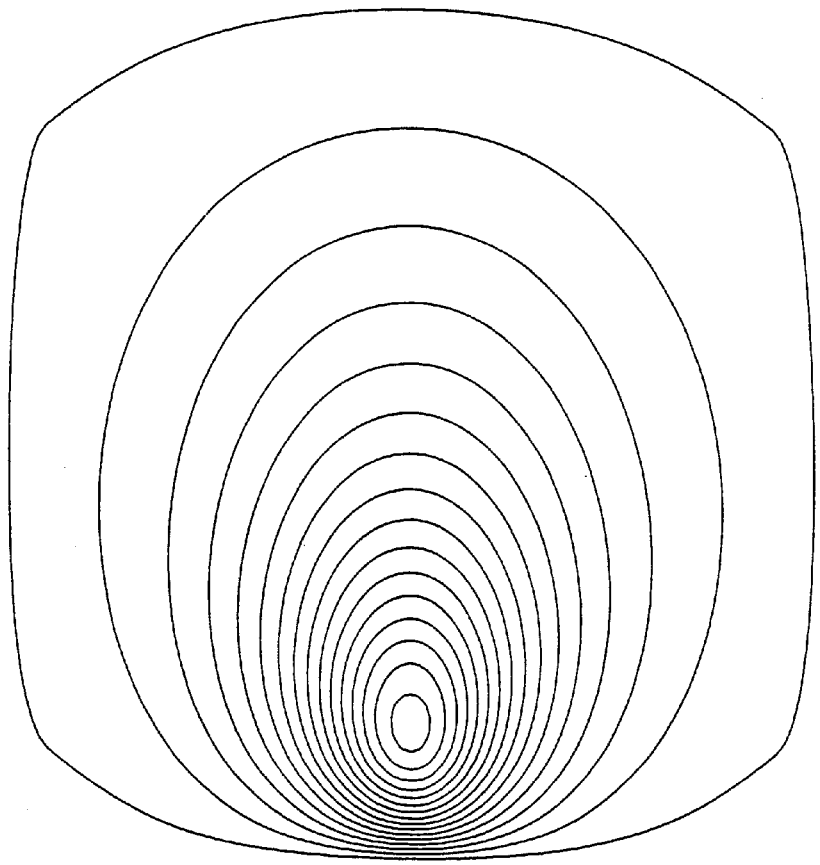

For the first shield Y uniplanar module, by employing the stream function technique, the discrete current pattern for the primary coil is comprised of 21 discrete loops (FIG. 15A) where each loop carries a constant current of 223.81 Amps. Similarly, the secondary coil's current density is approximated by 16 loops (FIG. 15B) where each loop carries a constant current of 223.81 Amps. Table 12 shows the electrical characteristics for the first module of the shielded Y uniplanar gradient coil, which is designed for main magnets with horizontally directed fields. The rise time, slew rates and gradient strengths are evaluated assuming a 400V/330 A gradient amplifier.

Figure 16A:
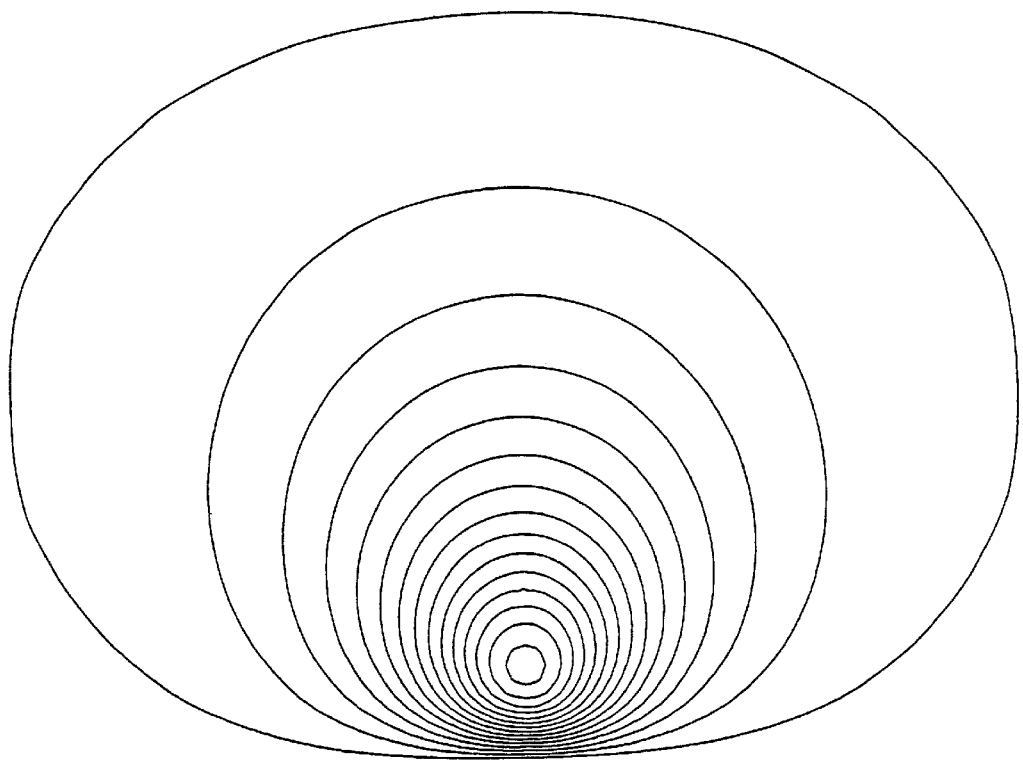
FIGS. 16A and 16B are diagrammatic illustrations of an exemplary second primary symmetric uniplanar y-gradient coil and a second shield coil for a horizontal system in accordance with the present invention.
Figure 16B:
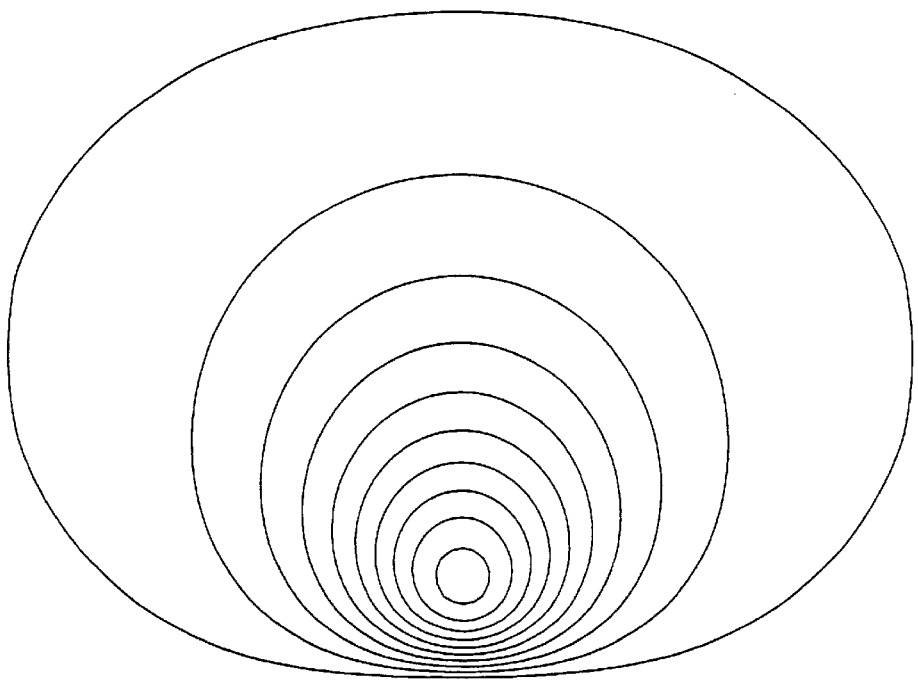

For the second Y shielded uniplanar module, the stream function technique leads to a discrete current pattern for the primary coil is comprised of 15 discrete loops (FIG. 16A) where each loop carries a constant current of 232.85 Amps. Similarly, the secondary coil's current density is approximated by 10 loops (FIG. 16B) where each loop carries a constant current of 232.85 Amps. Table 12 shows the electrical characteristics for the second module of the shielded Y uniplanar gradient coil, which is designed for main magnets with horizontally directed fields. The rise time, slew rates and gradient strengths are evaluated assuming a 400V/330 A gradient amplifier.

TABLE 12

Electrical Characteristics for the two shielded Y Uniplanar Modules

| Property | First Shielded Y Uniplanar module | Second Shielded Y Uniplanar module |
|---|---|---|
| Primary plane location | 0.006 m | 0.003 m |
| Shielding plane location | 0.03272 m | 0.03712 m |
| Number of discrete loops Primary/Secondary | 21/16 | 15/10 |
| Gradient Strength @ 330 A | 29.5 mT/m | 42.5 mT/m |
| Linearity at $y = \pm 20$ cm | 5.86% | 6.24% |
| Uniformity at $z = \pm 20$ cm | 23.71% | 23.12% |
| Inductance in $\mu H$ | 370 $\mu H$ | 210 $\mu H$ |
| Resistance in m$\Omega$ | 155 m$\Omega$ | 125 m$\Omega$ |
| Rise Time in $\mu sec$ | 350 $\mu sec$ | 193 $\mu sec$ |
| Linear Slew Rate @ 400 V | 85 T/m/sec | 220 T/m/sec |
| Sinusoidal Slew Rate @ 400 V | 95 T/m/sec | 265 T/m/sec |

Figure 17:
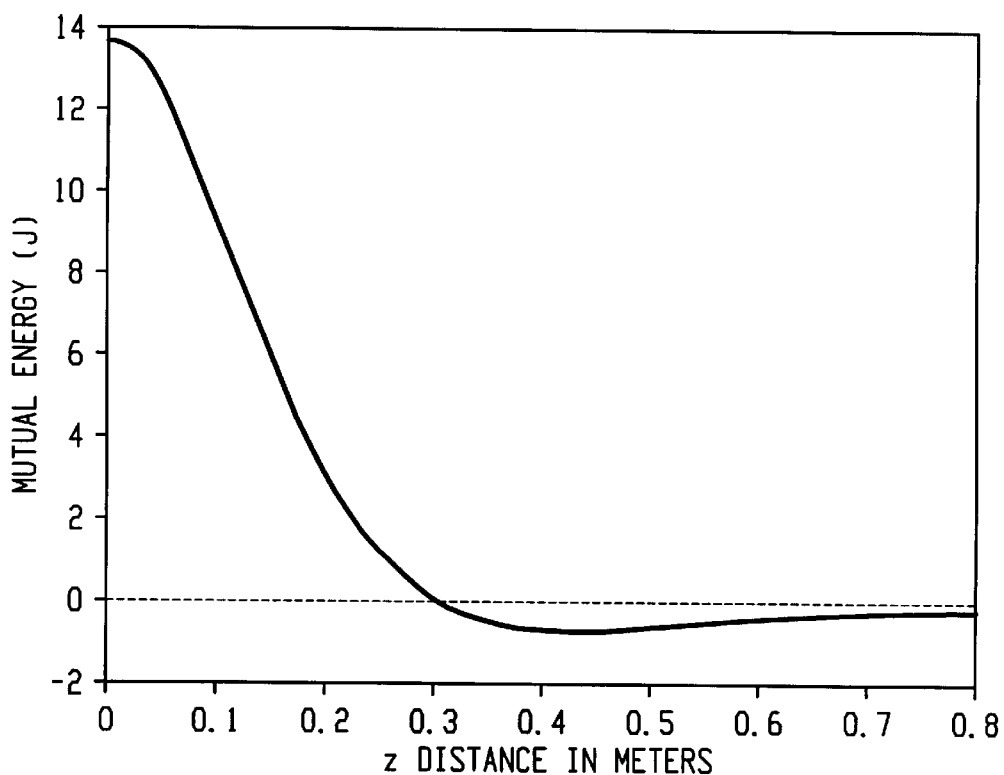
FIG. 17 is a plot of mutual energy vs. z-shift for the first and second symmetric uniplanar y-gradient coils for a horizontal system in accordance with the present invention.

Further, the mutual energy between these two modules was evaluated based on Equation (32). As FIG. 17 indicates, by axially shifting (along z) the first module coil relative to the second one, the mutual energy, and hence the mutual inductance, of these two modules goes through zero when the first module is shifted by z=296 mm away from the second coil module. In this case, there is no effect on the rise time or slew rate of the combined module system as long as the coils are axially separated by z=296 mm relative to each other (FIG. 17).

It should be appreciated that the specified current patterns can be changed to produce either better linearity at the price of coil efficiency, and/or greater efficiency at the price of linearity. Further, the dimensions of the gradient coils can be changed to be increased or decreased according to the preferred application. In addition, the lengths of the primary coils and/or the secondary coils can be similar or different.

The present invention is applicable to other alternative gradient coil geometries, such as elliptical, bi-planar, flared, etc., as well as the asymmetric gradient coil designs or any combination thereof. The present invention is also applicable to the design of gradient coil structures suitable for horizontally oriented or closed magnet systems. Further, the disclosed primary and screen coil set can be bunched (concentrated) or thumbprint designs generated using forward or inverse approach methods. In addition, the primary and the shield coils can have any possible mixing of bunched and/or thumbprint designs. It is contemplated that zero net thrust force or torque can be incorporated into the proposed design algorithm in a known manner.

Figure 18A:
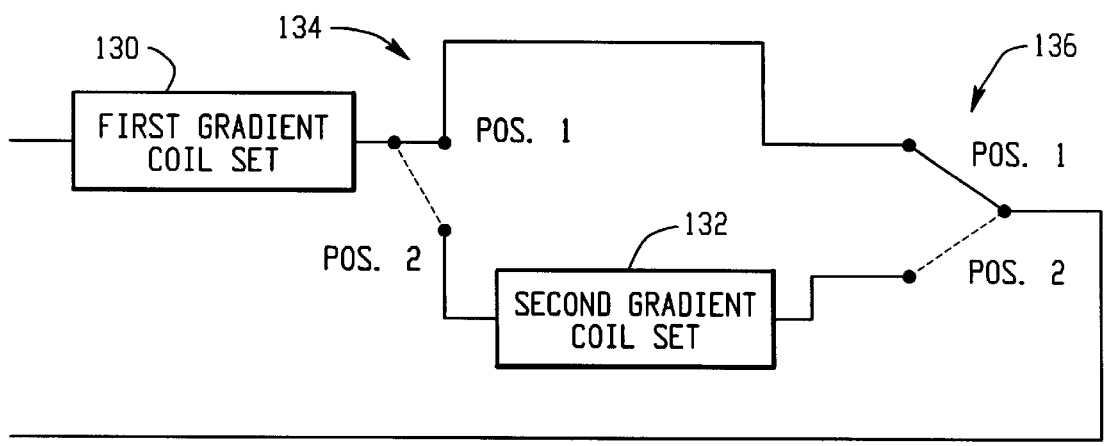
FIGS. 18A, 18B, and 18C are diagrammatic illustrations of various configurations for connecting the first and second uniplanar gradient coil sets for selective excitation in accordance with the present invention.
Figure 18B:
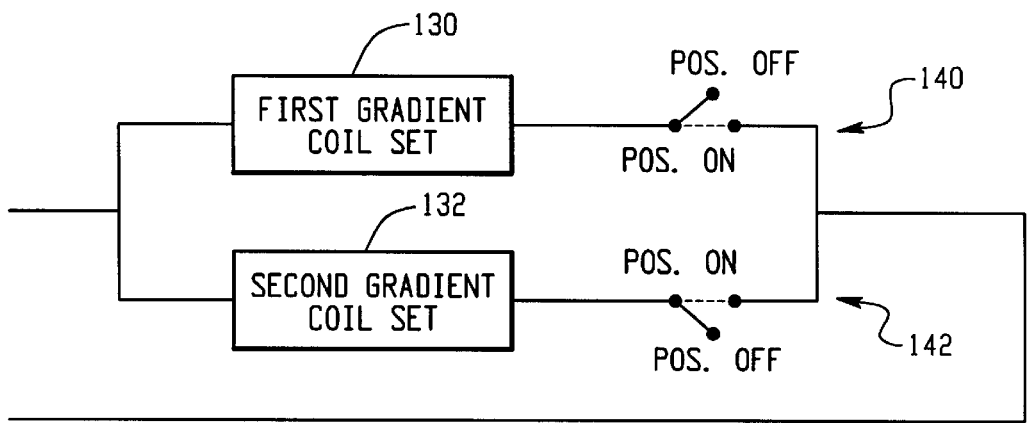
Figure 18C:
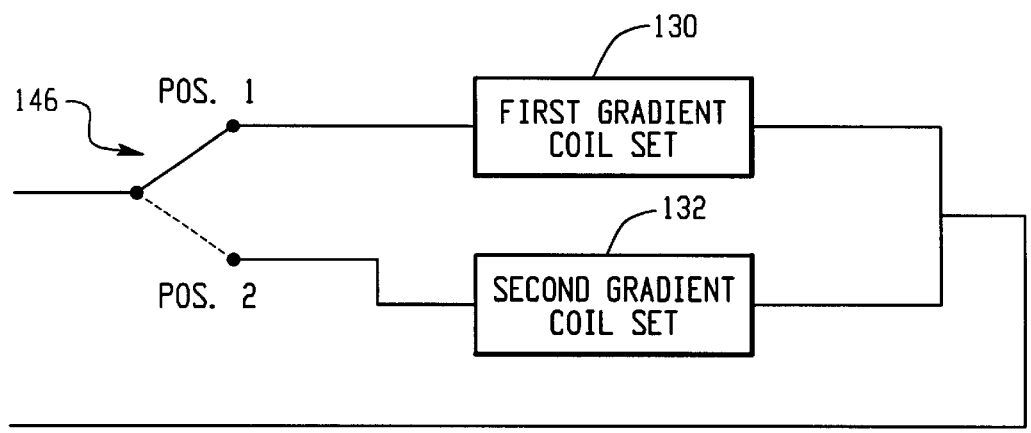

With reference to FIGS. 18A, 18B, and 18C, alternate ways of electrically connecting the first and second uniplanar gradient coil sets are provided. These methods include series and parallel connections of the two uniplanar gradient coil sets in such ways that one or both gradient coil sets may be selectively excited depending on the particular application. For example, in FIG. 18A, the first gradient coil set 130 and second gradient coil set 132 are electrically connected such that with the first and second switches 134, 136 both in position 1, only the first gradient coil set is excited. In contrast, with both switches 134, 136 in position 2, both the first and second gradient coil sets 130, 132 are excited while connected in series.

Alternately, in FIG. 18B, the first gradient coil set 130 is selectively excited with the first switch 140 in the "on position" and the second switch 142 in the "off position." Conversely, the second gradient coil set 132 is selectively excited with the second switch 142 in the on position and the first switch 140 in the off position. With both switches 140, 142 in the on position, both the first and second gradient coil sets 130, 132 are excited while connected in parallel.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance imaging apparatus comprising:
   a main magnet which defines an examination region in which the main magnet generates a main magnetic field;
   a couch for supporting a subject within the examination region;
   a planar gradient coil assembly disposed at least on one side of the subject for generating gradient magnetic fields across the examination region, the planar gradient coil assembly including:
      at least a first primary planar gradient coil set and a second primary planar gradient coil set disposed in an overlapping relationship, the first primary planar gradient coil set being displaced relative to the second primary planar gradient coil set such that mutual inductance between the first and second planar primary gradient coil sets is minimized;
   a current supply for supplying electrical current to the planar gradient coil assembly such that magnetic field gradients are selectively generated across the examination region in the main magnetic field by the planar gradient coil assembly;
   a radio frequency pulse generator for selectively exciting magnetic resonance dipoles disposed within the examination region;
   a receiver for receiving magnetic resonance signals from resonating dipoles within the examination region; and
   a reconstruction processor for reconstructing an image representation from the magnetic resonance signals.

2. The magnetic resonance imaging apparatus according to claim 1, wherein the planar gradient coil assembly includes:
   at least two shield coil sets, each shield coil set being disposed between a corresponding planar gradient coil set and adjacent structures that are on a common side of the subject as the planar gradient coil assembly.

3. The magnetic resonance imaging apparatus according to claim 2, wherein the main magnet includes a pair of pole faces which define therebetween the examination region in which the main magnet generates the main magnetic field vertically.

4. The magnetic resonance imaging apparatus according to claim 2, wherein the planar gradient coil assembly resides in a plane orthogonal to the main magnetic field.

5. The magnetic resonance imaging apparatus according to claim 2, wherein the main magnet is a cylindrically shaped solenoid having a central bore which defines the examination region, said main magnet generating a horizontally directed main magnetic field.

6. The magnetic resonance imaging apparatus according to claim 5, wherein the planar gradient coil assembly resides in a plane parallel to the main magnetic field.

7. The magnetic resonance imaging apparatus according to claim 1, wherein the first and second primary uniplanar gradient coil sets each include three gradient coil arrays for generating magnetic field gradients along three orthogonal axes, each having a geometric center and sweet spot in which the magnetic field it generates is substantially linear, said sweet spots of each primary gradient coil set being coincident with each other.

8. The magnetic resonance imaging apparatus according to claim 1, wherein the first and second primary uniplanar gradient coil sets each include three gradient coil arrays for generating magnetic field gradients along three orthogonal axes, each having a geometric center and sweet spot in which the magnetic field it generates is substantially linear, the sweet spots being adjacent each other such that the examination region is enlarged.

9. The magnetic resonance imaging apparatus according to claim 1, wherein the first and second primary gradient coil sets generate gradient magnetic fields across the examination region, which gradient magnetic fields have non-zero first derivatives in and adjacent the examination region.

10. The magnetic resonance imaging apparatus according to claim 1, wherein the planar gradient coil assembly is uniplanar and housed within the couch.

11. The magnetic resonance imaging apparatus according to claim 1, wherein the first primary uniplanar gradient coil set is a high-efficiency primary gradient coil set which enhances gradient switching speeds for ultra fast MR sequencing, and the second primary gradient coil set is a low-efficiency primary gradient coil set having a high-quality gradient field with a slower switching speed.

12. The magnetic resonance imaging apparatus according to claim 1, wherein the planar gradient coil assembly includes switching means for selectively coupling said first and second primary uniplanar gradient coil sets to operate in a selected one of modes in which (i) the first primary planar gradient coil set is energized alone, (ii) the second primary planar gradient coil set is energized alone, and (iii) both primary planar gradient coil sets are energized concurrently.

13. The magnetic resonance imaging apparatus according to claim 1, further including:
   a second uniplanar gradient coil assembly disposed parallel to the first planar gradient coil assembly on an opposite side of the subject.

14. A method of magnetic resonance imaging comprising:
   (a) generating a vertical main magnetic field in and through an examination region;
   (b) applying a first gradient magnetic field across the examination region with a first planar gradient coil during resonance excitation;
   (c) applying a second gradient magnetic field across the examination region with a second planar gradient coil during resonance data acquisition; and
   (d) acquiring and reconstructing resonance data into an image representation.

15. The magnetic resonance imaging method according to claim 14 further including:
   switching the second gradient magnetic field faster than the first gradient magnetic field; and
   the first gradient magnetic field being more linear than the second gradient magnetic field.

16. The magnetic resonance imaging method according to claim 15 wherein the first and second gradient magnetic fields are applied during an echo planar imaging sequence and the second gradient magnetic fields include a series of read gradients.

17. The magnetic resonance imaging method according to claim 14 further including:
   applying the first gradient magnetic field across a first portion of the examination region; and,
   applying the second gradient magnetic field across a second portion of the examination region, the first and second examination region portions being adjacent each other such that an elongated area is imaged.

18. A phased array planar gradient coil assembly for generating magnetic gradients across a main magnetic field of a magnetic resonance apparatus, the planar gradient coil assembly comprising:
   a first primary planar coil set including first planar x, y, and z-gradient coils, each first planar gradient coil having a sweet spot in which the magnetic field gradient generated is substantially linear, the sweet spots being coincident and in an examination region;
   at least a second primary planar coil set including second planar x, y, and z-gradient coils, each second planar gradient coil having a sweet spot in which the magnetic field gradient generated is substantially linear, the second coil set sweet spots being coincident with each other and in the examination region;
   the first and second primary planar coil sets being disposed in an overlapping relationship, the first primary planar coil set being displaced relative to the second primary planar coil set such that the mutual inductance between the first and second planar primary coil sets is minimized; and
   at least one planar shielding coil set between said first and second primary planar coil sets and adjacent structures for reducing the generated magnetic field gradients to substantially zero outside of the shielding coil set.

19. The phased array planar gradient coil assembly according to claim 18, wherein the first planar x, y and z-gradient coils have a first geometric center and the second x, y, and z-gradient coils have a second geometric center, at least one of the first and second primary coil sets having x, y, and z-gradient sweet spots coincident with each other, the examination region, the respective geometric center.

20. The phased array planar gradient coil assembly according to claim 18, wherein the first primary planar coil set is a high-efficiency primary coil set that enhances the performance of ultra fast gradient switching in MR sequences, and the second primary planar coil set is a low-efficiency primary gradient coil set having a high-quality gradient field.

21. The phased array planar gradient coil assembly according to claim 18, wherein the first primary planar coil set generates gradient magnetic fields across the examination region which are more precise and with slower switching speeds than the second primary planar coil set, and the second primary planar coil set generates gradient magnetic fields which are less precise and with a higher switching speed than the first primary planar coil set.

22. The phased array planar gradient coil assembly according to claim 18, further comprising:
   third and fourth primary planar coil sets being disposed in an overlapping relationship, the third primary planar coil set being displaced relative to the fourth primary planar coil set such that the mutual inductance between the third and fourth primary coil sets is minimized;
   the third and fourth primary planar coil sets being disposed parallel to the first and second primary planar coil sets and on an opposite side of the examination region from the first and second planar coil sets.

23. The phased array planar gradient coil assembly according to claim 18, wherein at least one of the first coil set sweet spot is defined asymmetrically relative to the first x,y, and z gradient coils.

24. The phased array planar gradient coil assembly according to claim 18, wherein the uniplanar gradient coil assembly is housed within an interior of a couch which supports a subject within the examination region.

25. A method of designing a phased array planar gradient coil assembly for magnetic resonance imaging systems, the method comprising:
   (a) selecting geometric configurations for a first primary planar coil set having a corresponding first shield coil set and at least a second primary planar coil set having a corresponding second shield coil set;
   (b) generating first and second continuous current distributions for the first primary and shield coil sets;
   (c) generating third and fourth continuous current distributions for the second primary and shield coil sets;
   (d) optimizing the first primary planar coil set with the first shield coil set utilizing an energy/inductance minimization algorithm;
   (e) optimizing the second primary planar coil set with the second shield coil set utilizing an energy/inductance minimization algorithm;
   (f) evaluating eddy currents within a prescribed imaging volume for both the first and second primary planar coil sets;
   (g) modifying at least one characteristic of the geometric configuration defined in step (a), and repeating steps (d) through (g) when the eddy currents from either (i) the first primary and shield coil sets or (ii) the second primary and shield coil sets do not meet an eddy current target value for the prescribed imaging volume;
   (h) discretizing the first primary and shield coil sets and the second primary and shield coil sets; and
   (i) displacing the first primary planar coil set at least one of axially and radially relative to the second primary planar coil set such that mutual inductance between the two is minimized.

26. The method according to claim 25, where at least one of steps (d) and (e) include:
   (j) minimizing net torque for the respective primary and shield coil sets.

27. The method according to claim 25, where step (g) includes:
   (k) modifying at least one of a length and a radius of (i) the first primary and shield coil sets or (ii) the second primary and shield coil sets.

28. The method according to claim 25, where step (g) includes:
   (l) modifying a field constraint of one of (i) the first primary and shield coil sets and (ii) the second primary and shield coil sets.

29. The method according to claim 25, where step (i) includes performing a mutual inductance minimization algorithm to minimize the mutual inductance between the first and second primary coil sets.

30. A shielded uniplanar gradient coil assembly designed by the method of claim 25.

* * * * *